US011716112B2

(12) United States Patent
Beaudin et al.

(10) Patent No.: US 11,716,112 B2
(45) Date of Patent: Aug. 1, 2023

(54) ABSORPTIVE FILTER

(71) Applicant: Qualcomm Incorporated, San Diego, CA (US)

(72) Inventors: Steve Andre Beaudin, Fremont, CA (US); Patric Heide, Vaterstetten (DE); Wai San Wong, San Diego, CA (US); Stefan Freisleben, Neubiberg (DE); Eyal Hochdorf, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 16/950,736

(22) Filed: Nov. 17, 2020

(65) Prior Publication Data

US 2022/0158686 A1 May 19, 2022

(51) Int. Cl.
*H04B 1/525* (2015.01)
*H03F 3/60* (2006.01)
*H03H 7/46* (2006.01)
*H04B 1/00* (2006.01)

(52) U.S. Cl.
CPC ............ *H04B 1/525* (2013.01); *H03F 3/602* (2013.01); *H03H 7/463* (2013.01); *H04B 1/0057* (2013.01)

(58) Field of Classification Search
CPC ....... H04B 1/525; H04B 1/0057; H03F 3/602; H03H 7/463; H01P 1/20309; H01P 1/20; H01P 1/183
See application file for complete search history.

(56) References Cited

U.S. PATENT DOCUMENTS

| 4,532,484 A | * | 7/1985 | Tajima | H01P 5/185 333/116 |
|---|---|---|---|---|
| 5,382,925 A | * | 1/1995 | Hayashi | H03H 1/00 333/112 |
| 6,748,197 B2 | * | 6/2004 | Lindemann | H04B 1/3805 455/12.1 |
| 8,570,119 B2 | * | 10/2013 | Do | H01P 1/20309 333/202 |
| 9,130,653 B2 | * | 9/2015 | Walker | H04B 1/44 |
| 9,197,186 B2 | | 11/2015 | Schmidhammer | |

(Continued)

FOREIGN PATENT DOCUMENTS

WO WO-2017201534 A1 * 11/2017 ................ H01P 5/18

OTHER PUBLICATIONS

US 10,530,398 B2, 01/2020, Mandegaran (withdrawn)
International Search Report and Written Opinion—PCT/US2021/072429—ISA/EPO—dated Feb. 23, 2022.

*Primary Examiner* — Hafizur Rahman
*Assistant Examiner* — Kimberly E Glenn
(74) *Attorney, Agent, or Firm* — Colby Nipper; Qualcomm Incorporated

(57) ABSTRACT

An apparatus is disclosed with an absorptive filter. In an example aspect, an apparatus has a filter including a first filter port and a second filter port. The filter also includes a hybrid coupler, a signal combiner, a first filter unit, and a second filter unit. The hybrid coupler includes a first hybrid port, a second hybrid port, and a third hybrid port, with the first hybrid port coupled to the first filter port. The signal combiner is coupled to the second filter port. The first filter unit is coupled between the second hybrid port and the signal combiner. The second filter unit is coupled between the third hybrid port and the signal combiner.

30 Claims, 19 Drawing Sheets

(56) References Cited

U.S. PATENT DOCUMENTS

| | | | |
|---|---|---|---|
| 9,571,133 B2 | 2/2017 | Schmidhammer et al. | |
| 10,560,129 B2 | 2/2020 | Mandegaran | |
| 10,854,945 B2 | 12/2020 | Zhu et al. | |
| 2006/0019611 A1 | 1/2006 | Mages | |
| 2012/0326808 A1 | 12/2012 | Moreno et al. | |
| 2015/0117280 A1* | 4/2015 | Khlat | H04B 1/50 370/297 |
| 2015/0236390 A1 | 8/2015 | Analui et al. | |

\* cited by examiner

ABSORPTIVE FILTER

TECHNICAL FIELD

This disclosure relates generally to electronic devices and, more specifically, to communication with a filter.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, health, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. A smartphone can also communicate with a network via an access point (AP), such as a Wi-Fi access point. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

To provide these and other types of services, electronic devices typically use a wireless transceiver to communicate wireless signals in accordance with some wireless standard. Examples of wireless standards include a 4th Generation (4G) cellular standard and an IEEE 802.11b or 802.11g Wi-Fi standard, both of which are used today with smartphones and other connected devices. These wireless standards enable a certain wireless communication speed. To enable faster wireless networks, efforts are underway to create newer wireless standards. Next-generation cellular networks and advanced Wi-Fi networks, for example, are expected to offer significantly higher bandwidths, lower latencies, and access to additional electromagnetic (EM) spectrum. Taken together, this means that exciting new wireless services can be provided to users, such as safer self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones and other traditional computing devices will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. To enable next-generation wireless technologies, some IoT devices and electronic devices generally will operate in accordance with 5th Generation (5G) cellular standards and newer Wi-Fi standards. Such devices will communicate with signals that use wider frequency ranges that are located at higher frequencies of the EM spectrum as compared to those devices that operate in accordance with older wireless standards. For example, many newer devices will be expected to operate at millimeter wave (mmWave) frequencies (e.g., frequencies between at least 24 and 300 Gigahertz (GHz)), as well as at frequencies in the single-digit GHz.

To accommodate these commercial expectations and surmount the associated technical hurdles, the physical components that enable wireless communications under these constraints will be expected to operate efficiently at higher frequencies. One component that facilitates electronic communication is the wireless interface device, which can include a wireless transceiver and a radio-frequency front-end (RFFE). Unfortunately, the wireless interface devices designed for electronic devices that operate in accordance with the Wi-Fi and 4G cellular standards of today are not adequate for the faster Wi-Fi and 5G wireless standards of tomorrow, for these standards are expected to accommodate higher frequencies, account for more-stringent latency demands, and meet tighter fiscal constraints.

Consequently, to facilitate the adoption of newer cellular and faster Wi-Fi technologies, as well as the widespread deployment of electronic devices that can provide new capabilities and services, wireless interface devices will be deployed having designs that can handle GHz frequencies. These wireless interface devices will also be designed to efficiently share the available EM spectrum. Electrical engineers and other designers of electronic devices are therefore striving to develop new wireless interface devices that will enable the promise of Sub-6 GHz, 5G, faster Wi-Fi, and other higher-frequency technologies to become a reality.

SUMMARY

An absorptive filter can produce appreciably lower signal reflections as compared to a non-absorptive filter. Described filters can be absorbent both in the passband and outside of the passband. In example implementations, from an input port of a filter, the filter splits a signal into two split signals along first and second filtering paths respectively having first and second filter units. The first and second filter units may be substantial duplicates of each other. One filtering path provides phase-shifting relative to the other filtering path prior to the split signals reaching the filter units. The filter unit of each filtering path may reflect a portion of a split signal, especially outside of the passband. The reflected split signal from the phase-shifted filtering path is phase-shifted again during propagation back toward the input port. For example, one split signal can be shifted by ninety degrees (90°) twice, resulting in a 180° phase shift. The double phase shifting of one reflected split signal causes the two reflected split signals to destructively interfere at the input port of the filter. As the filtered split signals propagate toward an output port of the filter, the filtering path having a split signal that is not phase-shifted prior to the filter unit can phase shift the filtered split signal to align the phases of the two filtered split signals before reaching the output port. The filter combines the power of the two aligned and filtered split signals to produce a combined filtered signal. The combined filtered signal can be provided as-is to the output port or further filtered with another stage. Thus, the filter can output a filtered signal while producing lower signal reflections from the input port of the filter. Various alternatives are described herein.

In an example aspect, an apparatus is disclosed that includes a filter. The filter includes a hybrid coupler, a signal combiner, a first filter unit, and a second filter unit. The hybrid coupler includes a first hybrid port, a second hybrid port, and a third hybrid port, with the first hybrid port coupled to a first filter port. The signal combiner is coupled to a second filter port. The first filter unit is coupled between the second hybrid port and the signal combiner. The second filter unit is coupled between the third hybrid port and the signal combiner.

In an example aspect, an apparatus for filtering a signal is disclosed. The apparatus includes means for splitting the signal into a first signal and a second signal, with the second signal having a phase that is shifted relative to the first signal. The apparatus also includes means for filtering the first signal to produce a first filtered signal and a first reflected signal and means for filtering the second signal to produce a second filtered signal and a second reflected signal. The apparatus additionally includes means for combining the first filtered signal and the second filtered signal to produce a combined filtered signal. The apparatus further includes means for absorbing the first reflected signal and the second reflected signal.

In an example aspect, a method for operating a filter is disclosed. The method includes splitting a signal into a first signal and a second signal, including shifting a phase of the second signal relative to the first signal. The method also includes filtering the first signal to produce a first filtered signal and a first reflected signal and filtering the second signal to produce a second filtered signal and a second reflected signal. The method additionally includes combining the first filtered signal and the second filtered signal to produce a combined filtered signal. The method further includes absorbing the first reflected signal and the second reflected signal.

In an example aspect, an apparatus is disclosed. The apparatus includes a hybrid coupler, a first filtering path, a second filtering path, and a signal combiner. The hybrid coupler is configured to split a signal from a first filter port into a first signal and a second signal, with the second signal having a different phase than the first signal. The first filtering path is coupled to the hybrid coupler and configured to filter the first signal to produce a first filtered signal and a first reflected signal. The second filtering path is coupled to the hybrid coupler and configured to filter the second signal to produce a second filtered signal and a second reflected signal. The signal combiner is coupled to the first filtering path and the second filtering path. The signal combiner is configured to combine the first filtered signal and the second filtered signal to produce a combined filtered signal for a second filter port. The hybrid coupler is configured to circulate the first reflected signal and the second reflected signal to substantially cancel the first reflected signal and the second reflected signal relative to the first filter port.

BRIEF DESCRIPTION OF DRAWINGS

FIGS. 3-1 to 3-3 illustrate example schematic diagrams of absorptive filters that include a hybrid coupler, multiple filter units, and a signal combiner.

FIG. 3-4 illustrates example signaling that propagates within an absorptive filter.

FIGS. 4-1 and 4-2 illustrate example signals propagating through a hybrid coupler of an absorptive filter.

FIGS. 5-1 and 5-2 illustrate example hybrid couplers.

FIGS. 6-1 and 6-2 illustrate example filter units.

FIGS. 7-1 and 7-2 illustrate example signal combiners.

FIGS. 8-1 to 8-4 illustrate example implementations of absorptive filters, including ones with unidirectional and bidirectional absorption.

DETAILED DESCRIPTION

Figure 1:
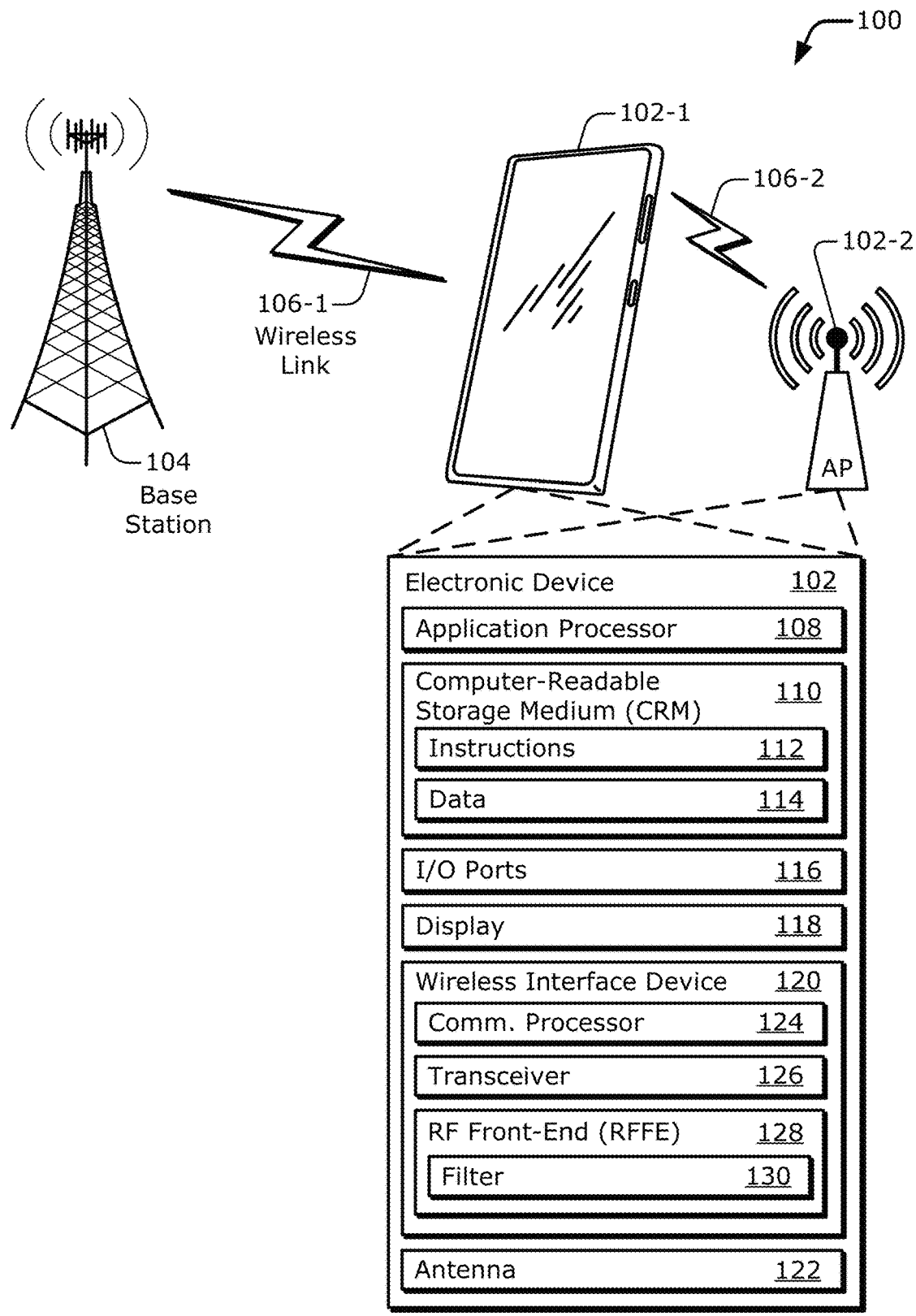
FIG. 1 illustrates an example environment with electronic devices having a wireless interface device, which includes a filter that may be absorptive.

An electronic device may include multiple filters. A filter can accept an input signal having power at multiple frequency ranges and attenuate the power at one or more frequency ranges of these multiple frequency ranges. Power at the remaining frequency ranges of the multiple frequency ranges is passed as an output signal. The filter can therefore substantially remove undesired frequencies from the input signal. With an ideal filter, input signal power is attenuated within the filter or passed through the filter, depending on the frequency of the signal power. With physical filters, on the other hand, some input signal power is reflected back from the input of the filter. In some cases, this can impair the operation of a component that is coupled "upstream" of the filter—e.g., a component that feeds the input signal to the filter.

A wireless interface device of an electronic device can include multiple portions: a communication processor, a transceiver, and a radio-frequency front-end (RFFE). The wireless interface device typically includes one or more filters and at least one power amplifier that are disposed among these portions. The wireless interface device may also include control circuitry, such as a closed-loop controller. In some cases, the RFFE includes a power amplifier that provides a signal to a filter of the RFFE. The transceiver can include a feedback receiver that is coupled to the output of the power amplifier via a directional coupler. In operation, the feedback receiver provides an indication of the signal output by the power amplifier to the closed-loop controller, which can be implemented as part of the communication processor.

The closed-loop controller can implement digital predistortion (PDP), error vector magnitude (EVM) correction, and so forth to facilitate the power amplifier attaining targeted operational parameters. The closed-loop controller can improve operation of the power amplifier based on obtaining an accurate indication of the signal output by the power amplifier. The ability of the closed-loop controller is impaired if the accuracy of the indication is reduced. The filter, unfortunately, can reduce the accuracy of this indication due to signal reflection from the input of the filter. The filter accepts an output signal from the power amplifier. The filter produces signal reflections based on this output signal, particularly outside of the passband of the filter. The feedback receiver therefore receives a reflected signal that has increased power at a subset of the frequencies of the output signal originally provided by the power amplifier. Further, the reflected signal is delayed in time relative to the power amplifier's output signal. Accordingly, the feedback receiver is unable to provide an accurate indication of the output signal to the closed-loop controller, and the closed-loop controller is unable to properly control the transmission of wireless signals to meet targeted operational parameters.

To address these issues, this document describes filters that are absorbent and therefore produce appreciably lower signal reflections. The filters can be absorbent both in the passband and outside of the passband. In example implementations, from an input port of a filter, the filter splits a signal into two split signals along a first filtering path and a second filtering path respectively having a first filter unit and a second filter unit. The first and second filter units may be substantial duplicates of each other. For example, each filter unit of the first and second filter units may include duplicated or substantially similar resonators. One filtering path provides phase-shifting relative to the other filtering path. The filter unit of each filtering path may reflect a portion of a split signal, especially outside of the passband. The reflected split signal from the phase-shifted filtering path is phase-shifted again during propagation back toward the input port of the filter. For example, one split signal can be shifted by ninety degrees (90°) twice, resulting in a 180° phase shift. The double phase shifting of one reflected split signal causes the two reflected split signals to destructively interfere at the input port of the filter.

Within the filter, the first and second filter units each produce a respective filtered split signal. The filtering path having a split signal that is not phase-shifted prior to the filter unit phase shifts the filtered split signal to align the phases of the two filtered split signals. The filter combines the power of the two aligned and filtered split signals to produce a combined filtered signal. The combined filtered signal can be provided as-is to an output port of the filter or further filtered with another stage. Thus, the filter can output a filtered signal while producing lower signal reflections from the input port of the filter. Various alternatives are described herein. For example, the filter can include a hybrid coupler that is realized with a hybrid matrix, which splits the input signal and phase shifts a split signal. A signal combiner can be realized with another hybrid coupler or a summing node in conjunction with a phase shifter. Further, some described implementations entail a third filter unit that reduces a component count by avoiding duplicating each filter component in the filter units disposed along each filtering path.

In operation, the destructive interference causes the reflected signals within the filter to substantially cancel each other out at the filter input port such that the filter does not generate an appreciable external reflected signal. The reflected signal can be reduced by 10-15 decibels (dBs) or more relative to a filter that does not employ the techniques that are described herein. Thus, by employing a described absorptive filter, signal reflection by a filter can be substantially reduced. The circuit components that are coupled "upstream" of the filter can therefore operate more accurately, operate more simply by obviating compensation strategies, combinations thereof, and so forth. In the example environments described above, with lower filter signal reflections, the closed-loop controller of the communication processor can more accurately control the output signal of the power amplifier to increase linearity using digital predistortion (DPD) techniques and to reduce the error vector magnitude (EVM) of the modulation constellation. Absorptive filters that are described herein can, however, be employed in other environments and be used in other scenarios.

Having described some aspects of absorptive filters generally above, this document also describes example aspects of absorptive filters in terms of one or more performance metrics. An electronic device can have a wireless interface device that includes a communication processor, a wireless transceiver, and a radio-frequency (RF) front-end. The wireless interface device typically includes a power amplifier, which may be part of the RF front-end (RFFE). One approach to enabling a wireless interface device to operate at higher frequencies or to meet specified targets of a given wireless standard is to improve performance of the RFFE generally or the power amplifier in particular. Performance metrics of these components include error vector magnitude (EVM) and power amplifier linearity. EVM pertains to how accurately or precisely a transceiver produces a specified modulation constellation. Power amplifier linearity indicates how closely an output of the power amplifier tracks an input thereof.

These two performance metrics can be improved using techniques that feed an output of the power amplifier back to control circuitry, which may be part of the communication processor of the wireless interface device. A feedback receiver, which may be part of the transceiver, accepts as a feedback signal an output of the power amplifier and amplifies this feedback signal. The amplified feedback signal is provided to a closed-loop controller of the communication processor. The closed-loop controller can condition a signal for transmitting, or perform other operations, to improve the performance metrics. For example, the EVM can be tuned or digital predistortion (DPD) can be implemented to preemptively counteract power amplifier nonlinearities before the nonlinearities affect a signal being amplified.

A signal that is output by the power amplifier is fed through a filter prior to being routed to an antenna. The filter attenuates undesired frequencies so that targeted frequencies are emanated from the antenna at a higher power level than the undesired frequencies. The targeted frequencies span a certain band, which may be termed a passband of the filter. Within the passband, signal power is absorbed by the filter from the perspective of the input side of the filer, and thus from the perspective of the output side of the power amplifier, because the signal at the passband frequencies is propagated through the filter and then forwarded from the filter output to the antenna. Signal power at other frequencies, however, may be absorbed at appreciably lower levels. In other words, some signal power is reflected back from the input of the filter toward the power amplifier and other components that are "upstream" of the filter. Frequencies near the edges of the passband can be reflected at especially impactful levels.

This reflected signal power can adversely impact the components on the input side of the filter, which is opposite the antenna side of the filter for a transmission operation. The power amplifier and the feedback receiver, for example, are on the input side of the filter. An input of the feedback receiver therefore accepts, in addition to the output signal of the power amplifier, this signal power from the filter that is a reflected version of the power amplifier output signal. Thus, the feedback receiver does not obtain an accurate indication of the power amplifier output signal. Accordingly, the closed-loop control circuitry that operates based on the output of the feedback receiver, likewise fails to obtain an accurate indication of the output signal of the power amplifier. Without an accurate indication of the power amplifier output signal, the closed-loop control circuitry cannot properly compensate for transceiver issues like nonlinearities or EVM deviations.

In contrast, absorptive filter implementations that are described herein appreciably reduce signal reflections from a filter, including a filter having an input that is coupled to an output of a power amplifier. To do so, a filter includes a hybrid coupler that is coupled to an input filter port of the filter. The hybrid coupler includes four hybrid ports: first, second, third, and fourth hybrid ports. The filter also includes a first filter unit and a second filter unit. The components or filtering characteristics of the second filter unit can be approximately duplicative of those of the first filter unit. For example, a set of resonators included in the first filter unit may be duplicated in the second filter unit. The filter further includes a signal combiner that is coupled to an output filter port. The first and second filter units are coupled between the hybrid coupler and the signal combiner.

In operation, the filter accepts a signal at the input filter port and couples the input signal to the first hybrid port of the hybrid coupler. The hybrid coupler splits the input signal into first and second signals and shifts a phase of the second signal relative to that of the first signal. The signal power may be split equally (e.g., a three-decibel (3 dB) split). The hybrid coupler provides the first signal to the first filter unit via the second hybrid port and the second signal to the second filter unit via the third hybrid port. The first filter unit filters the first signal to produce a first filtered signal. The first filter unit also reflects some signal power, especially outside of the passband, back to the second hybrid port as a first reflected signal. The second filter unit filters the second signal to produce a second filtered signal. The second filter also reflects some signal power, especially outside of the passband, back to the third hybrid port as a second reflected signal.

Within the hybrid coupler, the circuitry thereof propagates the second reflected signal from the third hybrid port back to the first hybrid port while shifting the phase a second time. In some cases, each phase shift is ninety-degrees) (90°) for a total phase shift of 180°. The hybrid coupler propagates the first reflected signal from the second hybrid port back to the first hybrid port, again without an appreciable phase shift. Thus, the second reflected signal is 180° out of alignment with the first reflected signal at the first hybrid port. These two signals destructively combine at the first hybrid port and a magnitude of a destructively-combined reflected signal at the input filter port is appreciably reduced, which results in an absorptive filter, even outside the passband. The first and second reflected signals may constructively combine at the fourth hybrid port, but this constructively-combined reflected signal can be innocuously routed to ground via a load element.

Within the passband, the first filter unit filters the first signal to produce the first filtered signal. Similarly, the second filter unit filters the second signal to produce the second filtered signal. The signal combiner combines the first and second filtered signals and forwards a combined filtered signal to the output filter port as a filtered signal for the filter. The signal combiner can be realized using another hybrid coupler that accounts for the phase difference between the first and second filtered signals. This approach can also provide bidirectional absorption for an absorptive filter. Alternatively, the signal combiner can be realized using a summing node; in such cases, the signal combiner can also include a phase shifter. The phase shifter can be coupled between the first filter unit and the summing node to align first and second phases of the first and second filtered signals.

In other implementations, a third filter unit can be coupled between the signal combiner and the output filter port. To reduce a component count, filtering components can be distributed between at least the first and third filter units as a first distributed filter unit and between at least the second and third filter units as a second distributed filter unit. Consider, for example, filter units that are realized with one or more acoustic resonators (e.g., a surface acoustic wave (SAW) resonator or a bulk acoustic wave (BAW) resonator). If the filter is to operate with seven acoustic resonators, each of the first and second filter units can include seven acoustic resonators, or fourteen (14) total resonators in the overall filter structure, if a third filter unit is not deployed. In this case, the seven acoustic resonators in each filter unit may be duplicates of each other. Alternatively, each of the first and second filter units can include three acoustic resonators, and the third filter unit can include the "other" four resonators to reach seven resonators per filtering path along each distributed filter unit. This example distributed filtering approach results in ten (10) total resonators for the filter, which equates to a savings of four (4) resonators. In this distributed filtering approach example, the three acoustic resonators in each of the first and second filter units may be duplicates of each other. Other filtering components, other quantities of filtering components, other divisions of acoustic or other resonators, etc. may be implemented instead.

In these manners, a filter that is absorptive outside of a passband thereof can be deployed using, for example, at least one hybrid coupler and at least two filter units allocated across at least two filter paths. Signal reflections from the filter units are substantially canceled at an input filter port of the filter to avoid sending the signal reflections back upstream from the input filter port. Components that are positioned on the upstream or input side of the filter therefore receive appreciably lower signal power from the signal reflections, including on frequencies that are outside the filter passband. In the wireless interface device environment described above, this means that a feedback component coupled to the input of the filter, and closed-loop control functionality that depends on the feedback component, can operate using a more accurate indication of the signal input to the filter. Transmission metrics such as linearity and EVM can therefore be improved—e.g., power amplifier linearity can be increased and EVM of a modulation constellation can be decreased. Although example absorptive filters are described above in a particular context, the absorptive filters that are described herein can be implemented in other environments or for other purposes.

FIG. 1 illustrates an example environment 100 with an electronic device 102 having a wireless interface device 120, which includes a filter 130 that may be absorptive. In the environment 100, the example electronic device 102 can be implemented as a mobile electronic device 102-1 (e.g., a smartphone) or an access point 102-2 (AP 102-2). The access point 102-2 may, for instance, operate in accordance with a Wi-Fi® standard. As shown, the mobile electronic device 102-1 communicates with a base station 104 through a wireless link 106-1. Additionally or alternatively, the access point 102-2 may wirelessly communicate with another electronic device, like the mobile electronic device 102-1, using a wireless link 106-2. Further, the base station 104 may communicate with the access point 102-2 via another wireless link (not explicitly shown). Thus, in FIG. 1, the electronic device 102 is depicted as a smartphone or an access point. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

Generally, the base station 104 can communicate with an electronic device 102 via a wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between at least two electronic devices, such as between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6™ or WiGig®); an IEEE 802.16 standard (e.g., WiMAX™); a Bluetooth™ standard; and so forth. In some implementations, the wireless link 106 may provide power wirelessly, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, another electronic device, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118. The presentation can be based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 includes filters, switches, amplifiers, mixers, and so forth for routing and conditioning signals that are transmitted or received via the antenna 122. Thus, the transceiver 126 can include multiple components, such as an analog-to-digital converter (ADC) or a digital-to-analog converter (DAC). In operation, an ADC can convert from analog signals to digital signals, and a DAC can convert from digital signals to analog signals. An ADC or a DAC can be implemented as part of the communication processor 124 (e.g., as part of a modem or DSP), as part of the transceiver 126, or separately from both of them (e.g., as another part of an SoC or as part of the application processor 108).

The components or circuitry of the transceiver 126 can be implemented in any suitable fashion, such as with combined transceiver logic or separately as respective transmitter and receiver entities. In some cases, the transceiver 126, or another portion of the wireless interface device 120, can be implemented with multiple or different sections to implement respective transmitting and receiving operations (e.g., with separate transmit and receive chains). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

As shown, the filter 130 is part of the radio-frequency (RF) front-end 128 that may filter an RF signal that is provided via a filter port of the filter 130. However, a filter 130 that is absorptive may be implemented as part of another portion of the wireless interface device 120 or as part of another aspect of the electronic device 102 generally. In example implementations, the filter 130 can include at least one hybrid coupler, two or more filter units, and at least one signal combiner. Example schematic diagrams and internal signaling of a filter 130 are described below with reference to FIGS. 3-1 to 3-4. Example signaling manipulation and circulation with a hybrid coupler is described with reference to FIGS. 4-1 and 4-2. Example implementations of a hybrid coupler are described with reference to FIGS. 5-1 and 5-2. Example implementations of two or more filter units are described with reference to FIGS. 6-1 and 6-2. Example implementations of a signal combiner are described with reference to FIGS. 7-1 and 7-2. Example filter implementations with filter units having different impedances and with different absorption directionalities (e.g., unidirectional or bidirectional absorption) are described with reference to FIGS. 8-1 to 8-4. Next, however, an example operational environment is described in which a filter 130 can be deployed.

Figure 2:
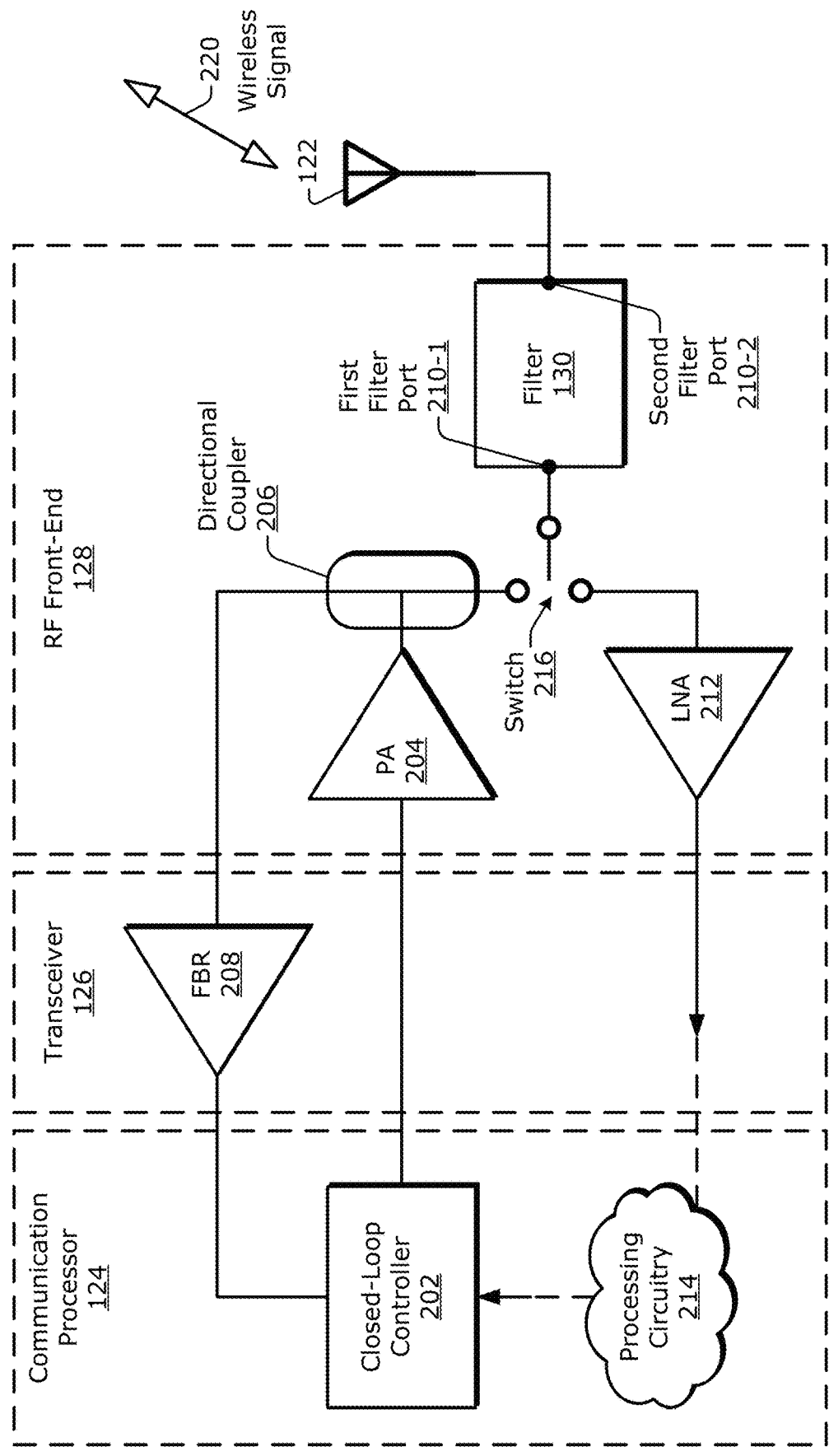
FIG. 2 illustrates an example wireless interface device including a closed-loop controller, a power amplifier, and a filter that may be absorptive.

FIG. 2 illustrates, at 200 generally, an example wireless interface device 120 (e.g., of FIG. 1) that includes multiple components of an example environment in which a filter 130 that is absorptive can be employed. Example components may include at least one closed-loop controller 202, at least one power amplifier 204 (PA 204), at least one directional coupler 206, at least one feedback receiver 208 (FBR 208), processing circuitry 214, at least one switch 216, and at least one filter 130. FIG. 2 also depicts a low-noise amplifier 212 (LNA 212) and at least one antenna 122. As shown, the filter 130 includes at least a first filter port 210-1 and a second filter port 210-2. Other wireless interface device implementations, however, may include more, fewer, or different components. For example, the at least one feedback receiver 208 can be omitted. If so, an absorptive filter can provide better EVM performance for a power amplifier that is running open loop power control, without any DPD.

In example implementations, these components can be disposed at, or can be part of, some aspect of the wireless interface device 120 (e.g., of FIG. 1). These aspects include the communication processor 124, the transceiver 126, and the RF front-end 128. As shown, the communication processor 124 includes the closed-loop controller 202 and the processing circuitry 214, and the transceiver 126 includes the feedback receiver 208. The RF front-end 128 includes the power amplifier 204, the directional coupler 206, the low-noise amplifier 212, the switch 216, and the filter 130.

These components can, however, be part of different aspects of the wireless interface device 120. Further, these aspects of the wireless interface device 120, as well as the illustrated components thereof, may be manufactured to be separate from each other or integrated with one or more other parts or components. For example, the communication processor 124 and at least part of the transceiver 126 may be integrated into one integrated circuit (IC). Further, one or more of the illustrated components of the RF front-end 128 can be integrated together and/or with at least some of the components of the transceiver 126. These various parts may also be combined into one or more packages and/or mounted on at least one printed circuit board (PCB), such as a flexible or a rigid PCB.

As illustrated by way of example, the second filter port 210-2 of the filter 130 is coupled to the antenna 122. Here, the filter 130 is coupled, via the first filter port 210-1, to the switch 216. The switch 216 enables time-division duplexing (TDD) for transmission and reception operations. Thus, the filter 130 is selectively coupled using the switch 216 to the power amplifier 204 for the transmission operations and to the low-noise amplifier 212 for the reception operations. Thus, a wireless signal 220 can be emanated from or received via the antenna 122. For transmission operations, a transmission signal, which the filter 130 accepts from the power amplifier 204 via switch 216, propagates through the filter 130 from the first filter port 210-1 to the second filter port 210-2. The filter 130 forwards a filtered transmission signal to the antenna 122 for emanation. For reception operations, a reception signal, which the filter 130 accepts from the antenna 122, propagates through the filter 130 from the second filter port 210-2 to the first filter port 210-1. The filter 130 forwards a filtered reception signal over the switch 216 to the low-noise amplifier 212. In other cases, the filter 130 can be implemented as a unidirectional filter or can be operated unidirectionally. Although TDD implementations are explicitly shown in FIG. 2 and described herein, the filter 130 can alternatively or additionally be employed in frequency-division duplexing (FDD) implementations.

With regard to the transmission path, an output of the closed-loop controller 202 is coupled to an input of the power amplifier 204. An output of the power amplifier 204 is coupled to the directional coupler 206 and to the first filter port 210-1 via the switch 216. The directional coupler 206 is coupled to an input of the feedback receiver 208, and an output of the feedback receiver 208 is coupled to a feedback input of the closed-loop controller 202. Although only certain components are explicitly depicted in FIG. 2 and are shown coupled together in a particular manner, a wireless interface device 120 or the RF front-end 128 thereof may include other non-illustrated components, more or fewer components, differently-coupled arrangements of components, and so forth.

The wireless interface device implements one or more techniques to condition a signal so that a transmission operation meets some specified criterion. Examples of such techniques include digital predistortion (PDP) to increase a linearity of the power amplification and error vector magnitude (EVM) adjustment to decrease an EVM of a modulation constellation used for the transmission signal. The absorptive characteristic of the filter 130 can facilitate these techniques. With respect to the closed-loop controller 202, closed-loop power control compensates for changes in RF gain to ensure the proper root-mean-square (RMS) power is maintained. This can be a relatively slow moving control loop to adjust the baseband gain as the RF gain changes over frequency or temperature. As part of the compensation, the closed-loop controller 202 alters a power of a transmission signal prior to providing the transmission signal to the power amplifier 204. To do so, the closed-loop controller 202 processes an indication of the output signal of the power amplifier 204 to determine how the power amplification is changing one or more characteristics of the transmission signal instantaneously or over time.

The closed-loop controller 202 therefore operates based on an indication of the output signal of the power amplifier 204. The directional coupler 206 couples an indication of this output signal to an input of the feedback receiver 208. The feedback receiver 208 amplifies the signal indication and provides the amplified signal indication to the closed-loop controller 202. The closed-loop controller 202 performs signal manipulation (e.g., a power adjustment) based on the amplified signal indication. Accordingly, if the signal indication of the output signal deviates from the actual output signal of the power amplifier 204, the performance of the closed-loop controller 202 is degraded. The filter 130 can remove the effect of filter return loss on the power coupled back to the RMS power detector (not shown) of the closed-loop controller 202 to increase the accuracy of the closed-loop power control.

The DPD technique performs a sample-by-sample pre-distortion to compensate for the nonlinearities of the power amplifier 204. The filter 130 can also increase the DPD accuracy by reducing reflections from the filter back to the DPD receiver. This may particularly impact intermodulation distortion (IM3) skirts that can be in the rejection band of the filter and that are more likely to be reflected back to the transceiver by a non-absorptive filter.

Thus, signal reflections from the first filter port 210-1 of the filter 130 can cause deviations in the output signal indication provided by the directional coupler 206 to adversely impact the power-control and DPD techniques described above. First, reflected signals can have more power outside of the passband of the filter 130 than within the passband, which is a distortion of the output signal of the power amplifier 204. Second, the reflected signals are delayed in time as compared to the original output signal of the power amplifier 204. Both of these distortions cause the indication of the output signal at the input of the feedback receiver 208 to deviate from the output signal of the power amplifier 204. Consequently, reducing the signal reflections of the filter 130 by absorbing would-be reflections can increase the accuracy of the indication of the output signal of the power amplifier 204.

Accordingly, implementing an absorptive filter 130 can improve performance of the closed-loop controller 202. Implementing an absorptive filter 130 can also improve the performance of the power amplifier 204. Further, although the antenna 122 is a passive element, making the filter 130 be bidirectionally absorptive can improve reception operations. The filter 130 can also include multiple filters to facilitate bidirectional communication, and such a filter can be implemented as at least part of a duplexer. Additionally, an absorptive filter 130 can be advantageously used in other areas of a wireless interface device 120, such as with a local oscillator (LO) termination in a superheterodyne transmitter. Moreover, an absorptive filter 130 can be employed in other parts of an electronic device 102 (e.g., of FIG. 1) in which signal reflections from a non-absorptive filter would decrease performance.

Figures 1, 3:
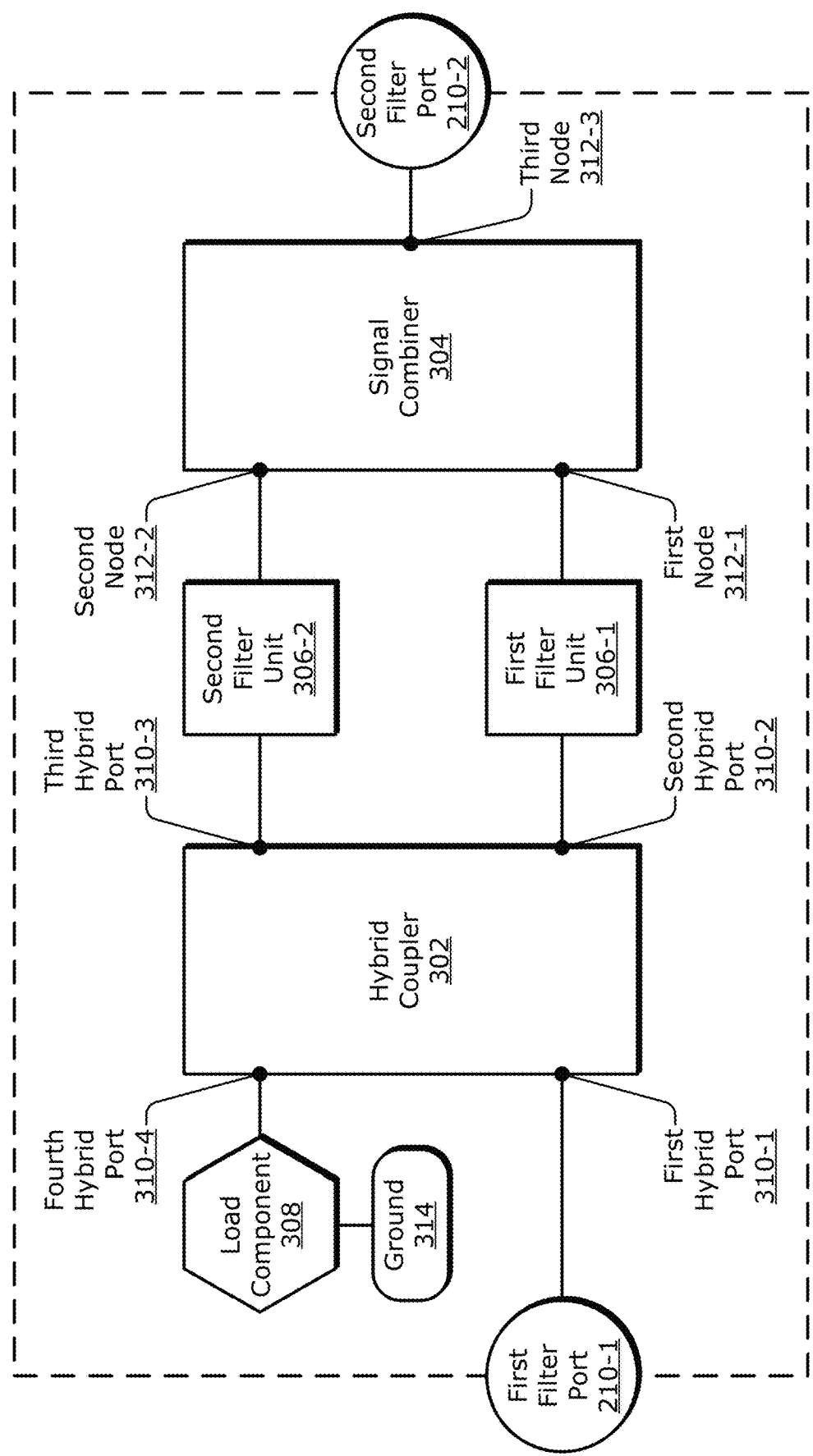
Figures 2, 3:
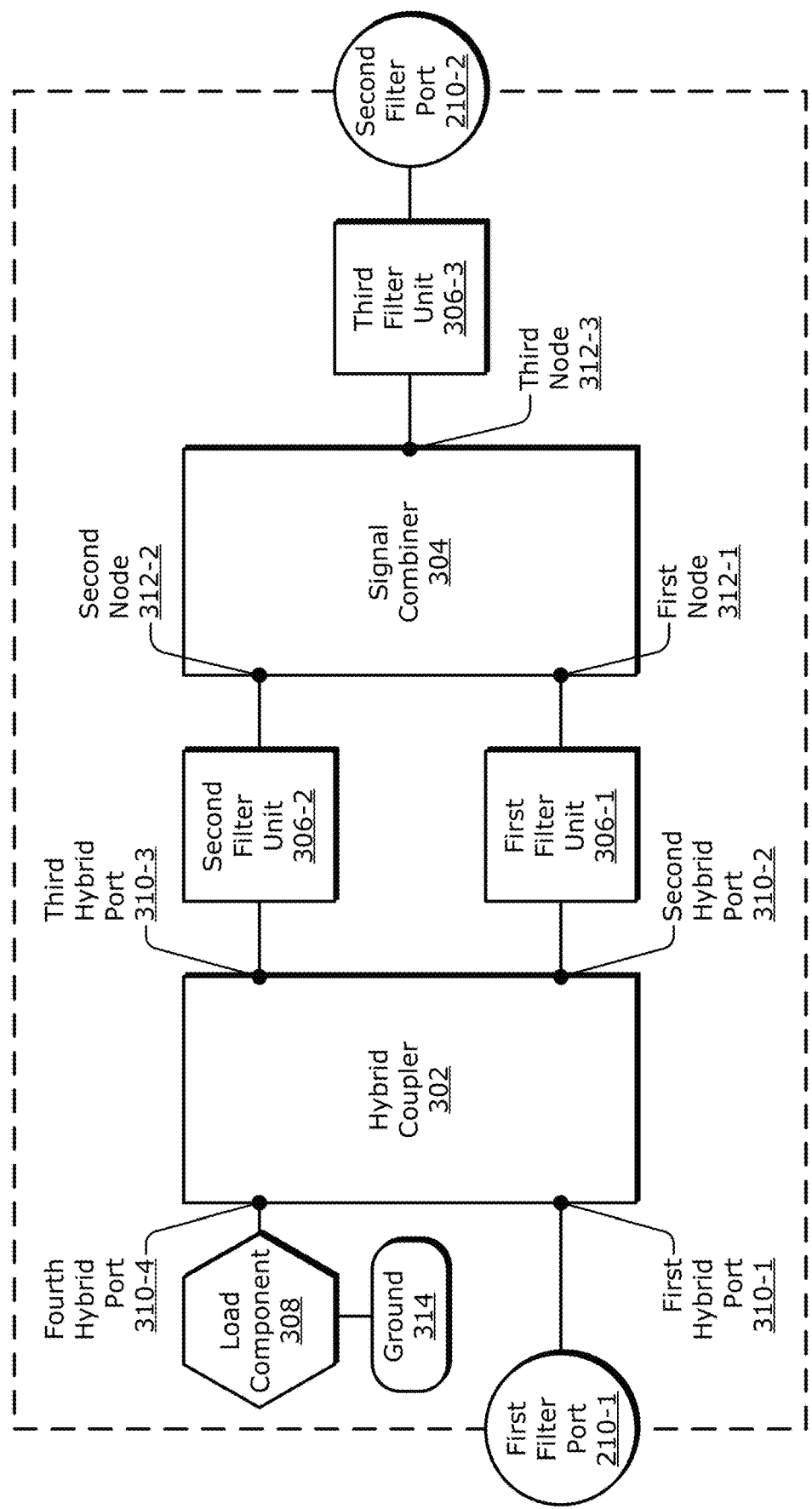
Figure 3:
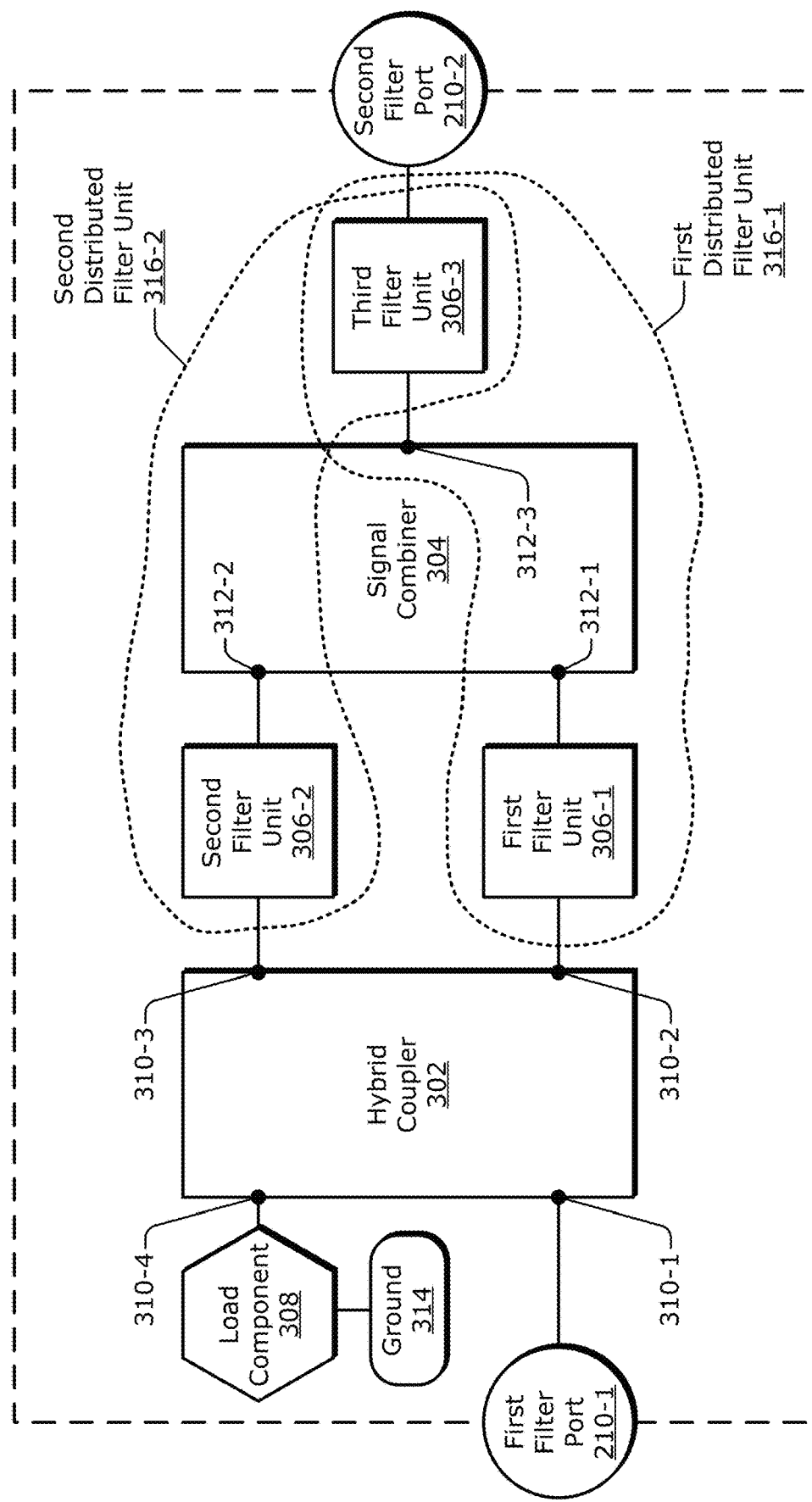

FIGS. 3-1 to 3-3 illustrate example schematic diagrams of absorptive filters that include a hybrid coupler, multiple filter units, and a signal combiner. In FIG. 3-1, an example filter 130-1 includes a first filter port 210-1, a second filter port 210-2, a hybrid coupler 302, a signal combiner 304, and multiple filter units. Here, the multiple filter units include a first filter unit 306-1 and a second filter unit 306-2. The hybrid coupler 302 includes a first hybrid port 310-1, a second hybrid port 310-2, a third hybrid port 310-3, and a fourth hybrid port 310-4.

In example implementations, the first hybrid port 310-1 is coupled to the first filter port 210-1. The signal combiner 304 is coupled to the second filter port 210-2. The first filter unit 306-1 is coupled between the second hybrid port 310-2 and the signal combiner 304. The second filter unit 306-2 is coupled between the third hybrid port 310-3 and the signal combiner 304. The first filter unit 306-1 may be realized using a first microacoustic filter, and the second filter unit 306-2 may be realized using a second microacoustic filter. Each filter unit 306 may, however, be realized with at least one different type of filter as described herein.

In some cases, the filter 130-1 includes a load component 308. The load component 308 is coupled between the fourth hybrid port 310-4 and a ground 314. Alternatively or additionally, the load component 308 may be separate from the filter 130-1. The signal combiner 304 can include multiple nodes. These multiple nodes may include a first node 312-1, a second node 312-2, and a third node 312-3. As described below, two or more nodes of the signal combiner 304 may be co-located with one another. As shown in FIG. 3-1, the first filter unit 306-1 can be coupled between the second hybrid port 310-2 and the first node 312-1, and the second filter unit 306-2 can be coupled between the third hybrid port 310-3 and the second node 312-2. Further, the third node 312-3 can be coupled to the second filter port 210-2.

In example operations, the hybrid coupler 302 directs signals that reflect from the first filter unit 306-1 and the second filter unit 306-2 to destructively combine relative to the first hybrid port 310-1 (e.g., destructively combine at or prior to reaching the first hybrid port 310-1). Accordingly, the power of a signal that does reflect from the first filter port 210-1 is substantially reduced. Further, the hybrid coupler 302 can direct the signals that reflect from the first filter unit 306-1 and the second filter unit 306-2 to constructively combine relative to the fourth hybrid port 310-4 (e.g., constructively combine at or by the fourth hybrid port 310-4). The signal power that results from the constructive combination is consumed by the load component 308 and/or routed to the ground 314. Examples of the signal reflections by the filter units and the signal circulations within the hybrid coupler 302 are described below with reference to FIGS. 3-4, 4-1, and 4-2.

For the reflected signals to constructively combine relative to the first hybrid port 310-1 in a manner that substantially cancels the reflected signals, the filter units can generate substantially similar reflected signals. For example, the first filter unit 306-1 can provide a first filter response, and the second filter unit 306-2 can provide a second filter response, with the first filter response being at least substantially similar to the second filter response. Here, substantially similar can include being within 5%, 10%, or 20% of each other, such as in terms of passband, frequency characteristics, insertion loss, scattering parameters, out-of-band reflectivity, and so forth. In an example approach, substantially similar filter responses can be achieved using substantially similar components. Thus, the first filter unit 306-1 can include one or more first components, and the second filter unit 306-2 can include one or more second components, with the one or more first components being at least substantially similar to the one or more second components. Here, components can be substantially similar if the electrical or electromagnetic values thereof are within 5%, 10%, or 20% of one another. Further, a quantity and/or circuit structure of multiple components can be the same as, or a functionally equivalent arrangement of, one another.

In the filter 130-1, each of the first filter unit 306-1 and the second filter unit 306-2 provides one stage of a filtering path between the hybrid coupler 302 and the second filter port 210-2. With this arrangement, each of the first filter unit 306-1 and the second filter unit 306-2 may provide an entirety of an intended, or architected, filtering of the filter 130-1. However, this arrangement can entail duplicating a full set of the components used to provided the intended filtering response. To reduce a component count, a third filter unit may be employed, as is described next with reference to FIGS. 3-2 and 3-3.

In FIG. 3-2, an example filter 130-2 includes the first filter unit 306-1, the second filter unit 306-2, and a third filter unit 306-3. In example implementations with a third filter unit, the third filter unit 306-3 is coupled between the signal combiner 304 and the second filter port 210-2. Specifically, the third filter unit 306-3 may be coupled between the third node 312-3 of the signal combiner 304 and the second filter port 210-2. In such cases, the first filter unit 306-1 and the second filter unit 306-2 each provide a first stage of filtering, and the third filter unit 306-3 provides a second stage of filtering. From another perspective, the first filter unit 306-1 and the third filter unit 306-3 jointly provide first signal filtering with a first distributed filter unit. Similarly, the second filter unit 306-2 and the third filter unit 306-3 jointly provide second signal filtering with a second distributed filter unit. The first and second filter stages thus jointly realize at least one distributed filter unit; example distributed filter units are described next with reference to FIG. 3-3.

In FIG. 3-3, an example filter 130-3 includes the first filter unit 306-1, the second filter unit 306-2, and the third filter unit 306-3. The first filter unit 306-1 and the third filter unit 306-3 together form a first distributed filter unit 316-1. The second filter unit 306-2 and the third filter unit 306-3 jointly form a second distributed filter unit 316-2. Thus, the first distributed filter unit 316-1 includes a first stage (or first filter stage) provided by the first filter unit 306-1 and a second stage (or second filter stage) provided by the third filter unit 306-3. Similarly, the second distributed filter unit 316-2 includes a first stage (or first filter stage) provided by the second filter unit 306-2 and a second stage (or second filter stage) that is also provided by the third filter unit 306-3. Accordingly, the combination of the first filter unit 306-1, the second filter unit 306-2, and the third filter unit 306-3 may correspond to a particular desired filter response that is provided by the filter 130-3.

The first filter unit 306-1, the second filter unit 306-2, and the third filter unit 306-3 can form multiple distributed filter units (e.g., the first and second distributed filter units 316-1 and 316-2). The multiple distributed filter units can jointly comprise a filter circuit having a filter response, which is partly realized by the third filter unit 306-3. By employing the third filter unit 306-3, component count can be lowered to decrease space or reduce costs. The filtering response provided by the filter 130-3 (or the filter 130-2 of FIG. 3-2) is determined by a combination of the first and third filter units 306-1 and 306-3 and by a combination of the second and third filter units 306-2 and 306-3. The components used in the first filter unit 306-1 may be duplicated in the second filter unit 306-2. The components used in the third filter unit 306-3, on the other hand, need not be duplicated. Consequently, whichever components are incorporated into the third filter unit 306-3, instead of into the first and second filter units 306-1 and 306-2, can be employed once in the filter 130-3 instead of twice.

A signal reflection from the third filter unit 306-3 may not be canceled relative to the first hybrid port 310-1. This signal reflection, however, is attenuated twice by the first and second filter units 306-1 and 306-2 before reaching the hybrid coupler 302. In other words, because the power of this signal reflection has been "doubly" attenuated by propagating through these filter units two times, the adverse effects of a signal reflecting back from the first filter port 210-1 to an upstream component are likewise appreciably reduced. This efficient use of components by employing at least a third filter unit to realize two or more distributed filter units is described below in terms of, e.g., resonators with reference to FIGS. 6-1 and 6-2.

Figures 3, 4:
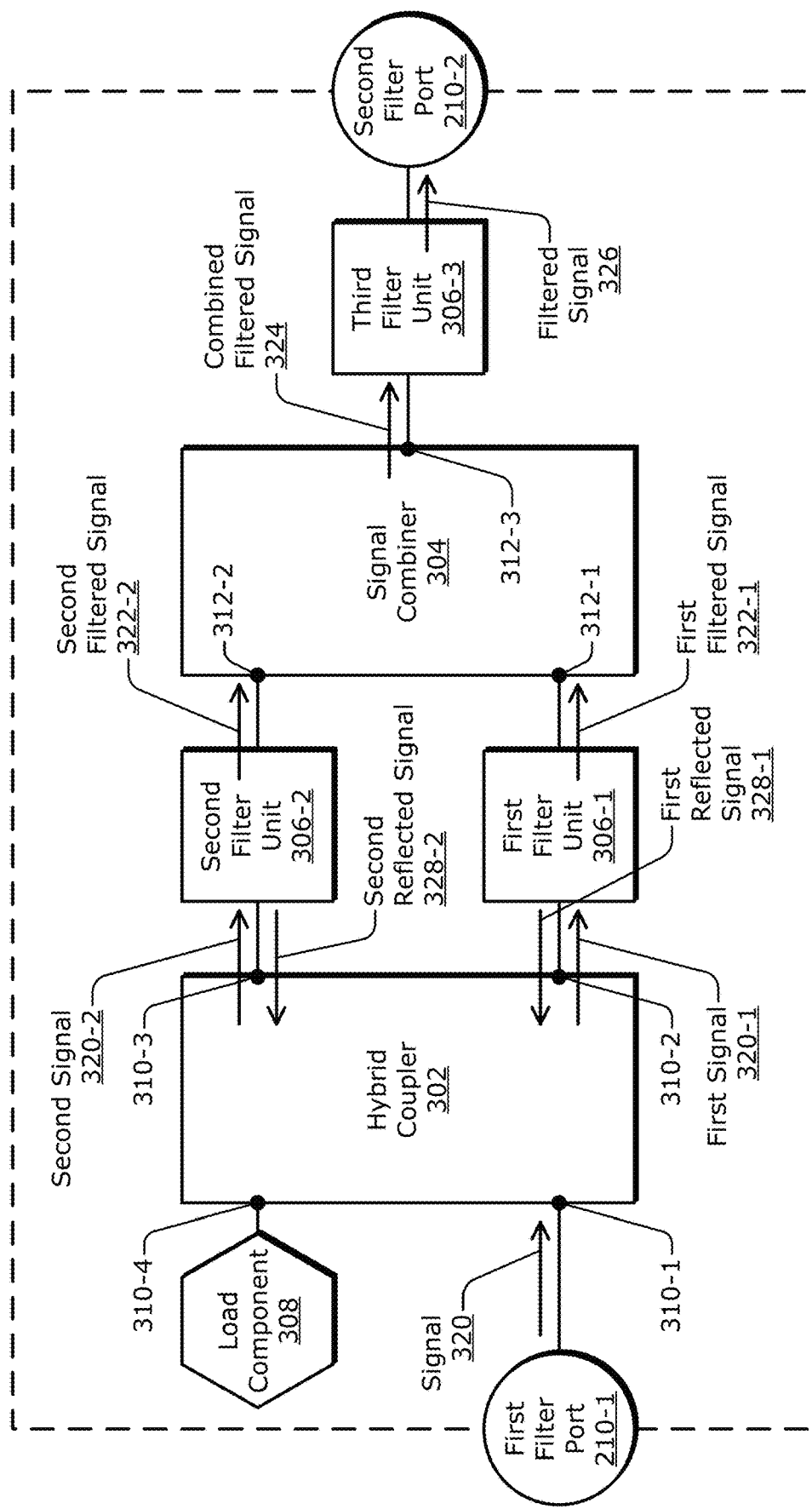
Figures 1, 4:
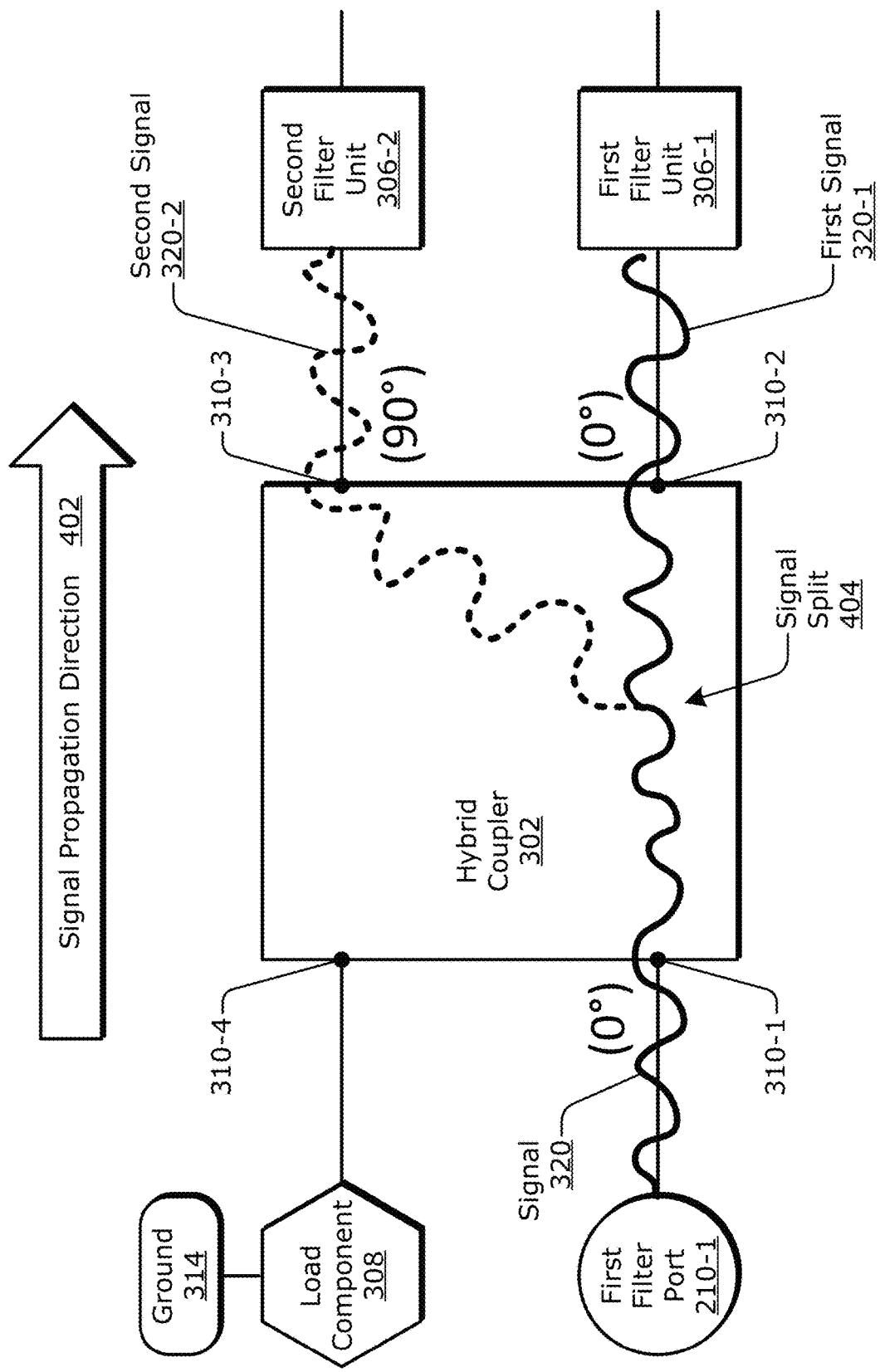
Figures 2, 4:
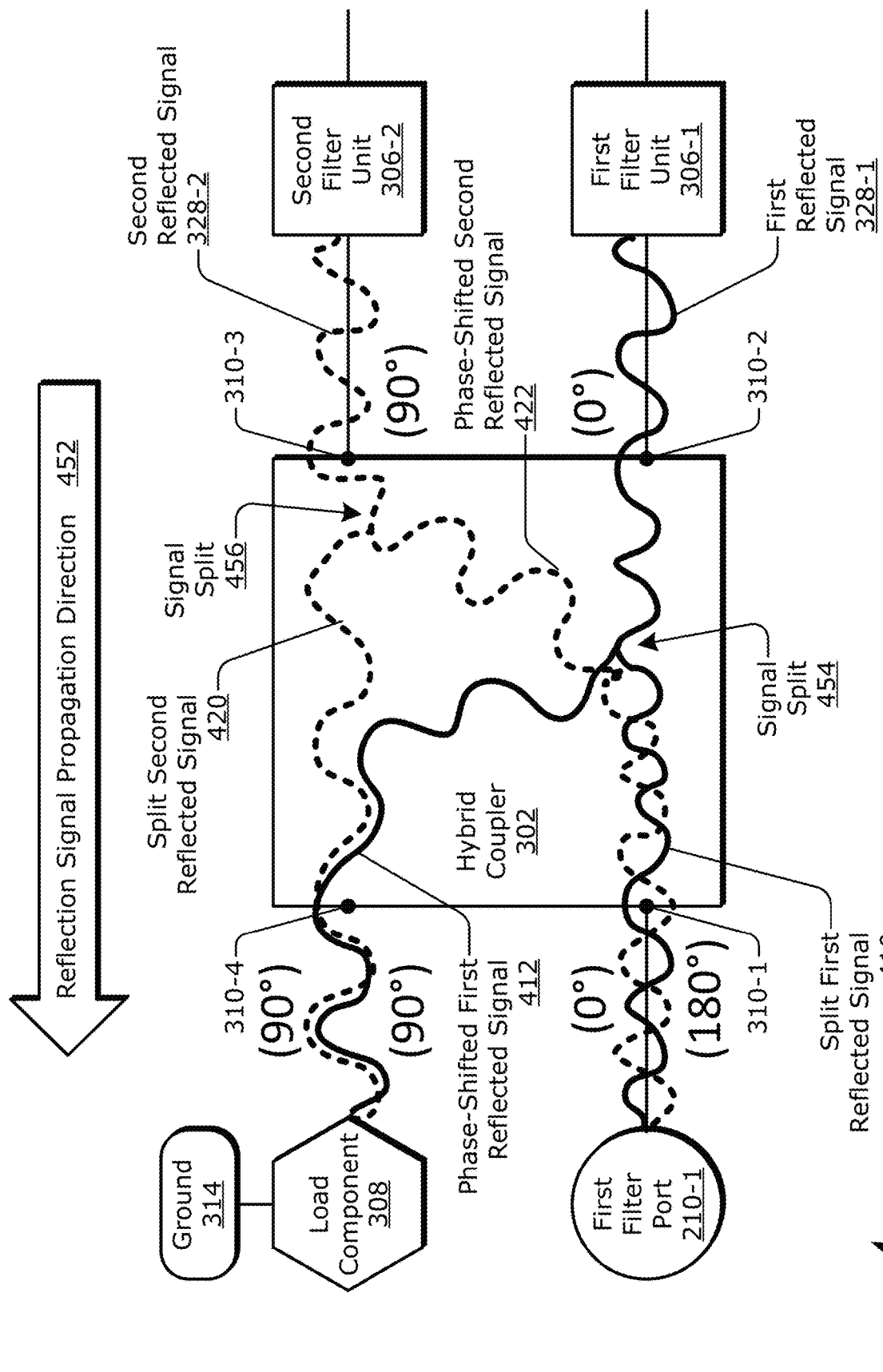

FIG. 3-4 illustrates example signaling that propagates within an example filter 130-4 that can absorb input signals, including those with frequencies outside the passband of the filter. As shown, a signal 320 enters the filter 130-4 at the first filter port 210-1. In example implementations, the first filter port 210-1 provides the signal 320 to the hybrid coupler 302 via the first hybrid port 310-1. The hybrid coupler 302 splits the signal 320 into a first signal 320-1 and a second signal 320-2. The hybrid coupler 302 may split the power of the signal 320 evenly between the first and second signals 320-1 and 320-2.

The hybrid coupler 302 outputs the first signal 320-1 at the second hybrid port 310-2 and provides the first signal 320-1 to the first filter unit 306-1. The first filter unit 306-1 filters the first signal 320-1 to produce a first filtered signal 322-1. The first filter unit 306-1 forwards the first filtered signal 322-1 to the signal combiner 304, such as to the first node 312-1 thereof. The first filter unit 306-1 additionally generates a first reflected signal 328-1 based on the first signal 320-1. The first filter unit 306-1 returns the first reflected signal 328-1 to the second hybrid port 310-2 of the hybrid coupler 302.

The hybrid coupler 302 also outputs the second signal 320-2 at the third hybrid port 310-3 and provides the second signal 320-2 to the second filter unit 306-2. The second filter unit 306-2 filters the second signal 320-2 to produce a second filtered signal 322-2. The second filter unit 306-2 forwards the second filtered signal 322-2 to the signal combiner 304, such as to the second node 312-2 thereof. The second filter unit 306-2 additionally generates a second reflected signal 328-2 based on the second signal 320-2. The second filter unit 306-2 returns the second reflected signal 328-2 to the third hybrid port 310-3 of the hybrid coupler 302.

The hybrid coupler 302 circulates the first and second reflected signals 328-1 and 328-2 so as to cause these reflected signals to substantially cancel each other at the first hybrid port 310-1 due to destructive combination. The first and second reflected signals 328-1 and 328-2 may also constructively combine at the fourth hybrid port 310-4, but this resulting signal is passed to the load component 308 and is not reflected to upstream components. The signal circulation is described below with reference to FIGS. 4-1 and 4-2.

In the filter 130-4, the signal combiner 304 accepts the first filtered signal 322-1 and the second filtered signal 322-2 and combines these filtered signals to produce a combined filtered signal 324. In some implementations (e.g., the filter 130-1 of FIG. 3-1 without a third filter unit 306-3), the combined filtered signal 324 can be output via the second filter port 210-2 as the filtered signal of the filter 130-4. In other implementations (e.g., the filter 130-2 of FIG. 3-2 having a third filter unit 306-3), the signal combiner 304 forwards the combined filtered signal 324 to the third filter unit 306-3 via the third node 312-3 of the signal combiner 304. The third filter unit 306-3 filters the combined filtered signal 324 to produce a filtered signal 326. The third filter unit 306-3 provides the filtered signal 326 to the second filter port 210-2 as the filtered signal of the filter 130-4.

FIGS. 4-1 and 4-2 illustrate example signals propagating through a hybrid coupler 302 of an absorptive filter. In example implementations, the hybrid coupler 302 accepts an incoming signal at one hybrid port and splits the accepted signal into at least two signals. The hybrid coupler 302 outputs the two split signals at two other hybrid ports. Thus, the hybrid coupler 302 splits a power of the accepted signal into two portions. In some cases, the power split may be allocated equally over the two signals such that each split signal has approximately 50% or half of the original power (e.g., a three-decibel (3 dB) split). The hybrid coupler 302 also phase shifts at least one split signal relative to the accepted signal or relative to the other split signal. In some aspects, the phase shift is approximately ninety degrees (90°) such that one split signal (e.g., a second split signal) has a phase that is offset by 90° from the other split signal (e.g., a first split signal). A hybrid coupler 302 may therefore be implemented using a ninety-degree (90°), three-decibel (3 dB) hybrid coupler. As used herein, "approximately" can connote that components are architected to achieve a given value, or at least be within 5%, 10%, or 20% of a specified value.

The examples described for FIGS. 4-1 and 4-2 operate based on a hybrid coupler 302 that splits power equally between two split signals and phase shifts one split signal by 90° relative to the other split signal. At 400-1 of FIG. 4-1, signals are propagating in a left-to-right direction as indicated at arrow 402. The hybrid coupler 302 accepts the signal 320 having a "default" 0° phase at the first hybrid port 310-1. The hybrid coupler 302 splits the signal 320 into the first signal 320-1 and the second signal 320-2 as indicated by a signal split 404. Generally, the first signal 320-1 is, and its reflection(s) are, depicted with a solid thick wavy line. In contrast, the second signal 320-2 is, and its reflection(s) are, depicted with a dashed thick wavy line. Here, the first and second signals 320-1 and 320-2 have approximately equal power levels.

The first signal 320-1 has a 0° phase, and the second signal 320-2 is phase-shifted to have a 90° phase. These two phases of the first and second signals 320-1 and 320-2 are therefore 90° apart from each other. The 0° phase of the signal 320 at the first hybrid port 310-1 may, however, differ from the 0° phase of the first signal 320-1 at the second hybrid port 310-2. The hybrid coupler 302 outputs the first signal 320-1 to the first filter unit 306-1 via the second hybrid port 310-2 and the second signal 320-2 to the second filter unit 306-2 via the third hybrid port 310-3. Signal reflections from the first and second filter units 306-1 and 306-2 are described with reference to FIG. 4-2.

At 400-2 of FIG. 4-2, reflection signals are propagating in a right-to-left direction as indicated at arrow 452. The first filter unit 306-1 produces the first reflected signal 328-1 based on the first signal 320-1 (e.g., of FIG. 4-1). The first filter unit 306-1 sends the first reflected signal 328-1, which has a 0° phase, to the second hybrid port 310-2. The hybrid coupler 302 splits the first reflected signal 328-1 into a split first reflected signal 410 and a phase-shifted first reflected signal 412 as indicated by a signal split 454. The signal split 454 results in equal signal power but a phase shift of one of the split signals. The split first reflected signal 410 has a 0° phase at the first hybrid port 310-1, but the phase-shifted first reflected signal 412 has a 90° phase at the fourth hybrid port 310-4.

The second filter unit 306-2 produces the second reflected signal 328-2 based on the second signal 320-2 (e.g., of FIG. 4-1). The second filter unit 306-2 sends the second reflected signal 328-2, which has a 90° phase, to the third hybrid port 310-3. The hybrid coupler 302 splits the second reflected signal 328-2 into a split second reflected signal 420 and a phase-shifted second reflected signal 422 as indicated by a signal split 456. The signal split 456 results in equal signal power but a phase shift of one of the split signals. The split second reflected signal 420 has the 90° phase at the fourth hybrid port 310-4, but the phase-shifted second reflected signal 422 has a 180° phase at the first hybrid port 310-1.

After the reflected signals are split and phase-shifted, at the first hybrid port 310-1, the split first reflected signal 410 has a 0° phase, and the phase-shifted second reflected signal 422 has a 180° phase. Thus, the split first reflected signal 410 and the phase-shifted second reflected signal 422 are 180° out-of-phase with respect to each other. Accordingly, these two signals destructively combine and substantially cancel each other at the first hybrid port 310-1. This results in an appreciably attenuated reflection back from the first filter port 210-1 toward upstream components (e.g., the power amplifier 204 and the feedback receiver 208 of FIG. 2).

After the reflected signals are split and phase-shifted, at the fourth hybrid port 310-4, the split second reflected signal 420 has a 90° phase, and the phase-shifted first reflected signal 412 also has a 90° phase. Thus, the split second reflected signal 420 and the phase-shifted first reflected signal 412 both have a same phase with respect to each other. Accordingly, these two signals constructively combine at the fourth hybrid port 310-4. The constructively combined signal, however, is innocuously routed thorough the load component 308 to the ground 314 instead of being reflected upstream. The filter 130 therefore substantially absorbs the signal power that is applied to the first filter port 210-1, at least from the perspective of an upstream component that supplied the input signal.

Figures 1, 5:
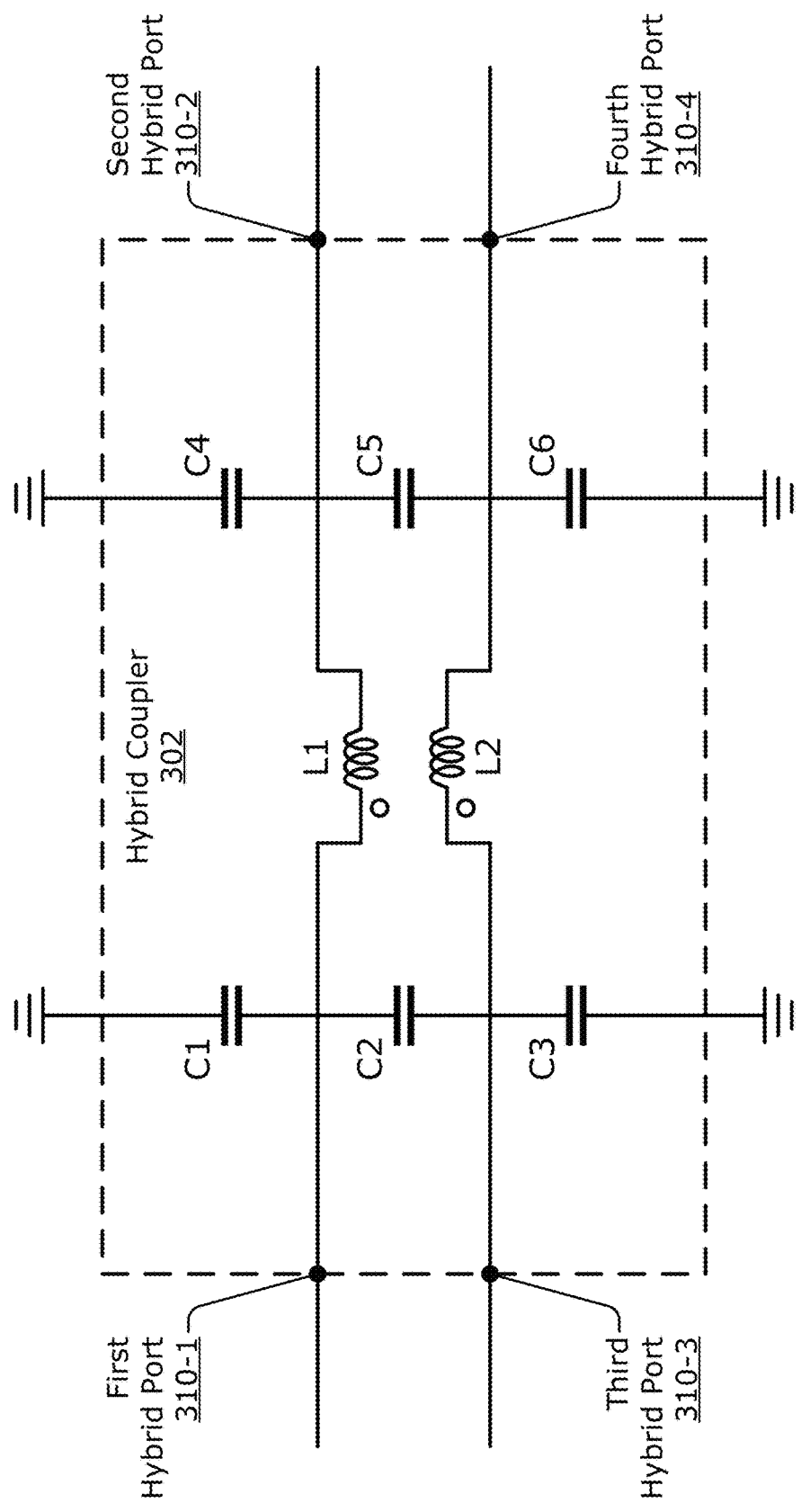
Figures 2, 5:
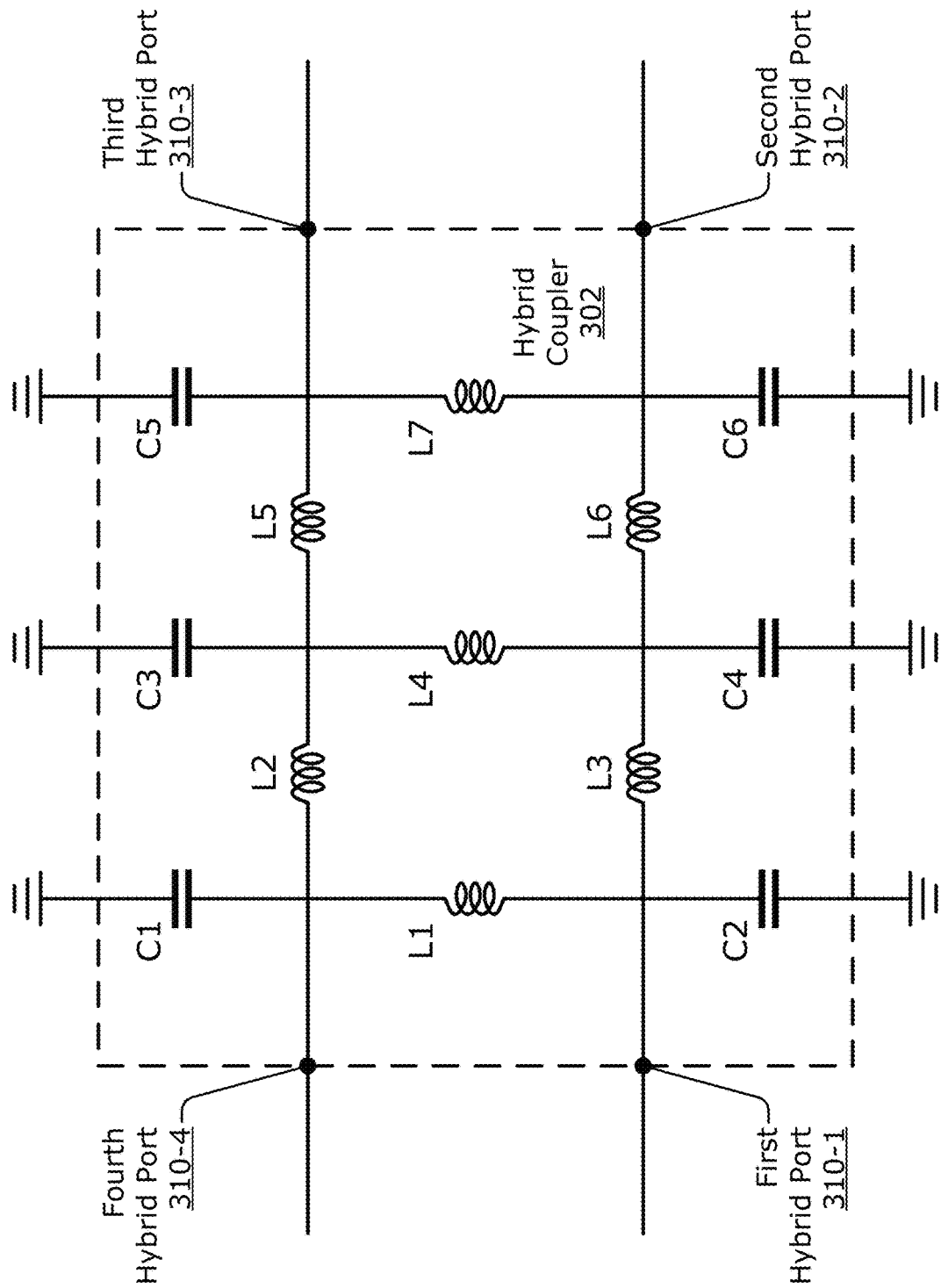

FIGS. 5-1 and 5-2 illustrate example hybrid couplers. Generally, a hybrid coupler 302 can be constructed using any circuitry. For example, the hybrid coupler 302 can include passive or active components. As explained below, the disjunctive "or" can entail an inclusive disjunctive. Accordingly, this indicates that the hybrid coupler 302 can include passive components, active components, or passive and active components. The examples described with reference to FIGS. 5-1 and 5-2, however, use passive components. Each hybrid coupler 302 can be realized using, for instance, a hybrid matrix including multiple elements, such as multiple passive elements. The multiple elements can include one or more lumped elements or one or more distributed elements.

In FIG. 5-1, at 500-1 generally, an example hybrid coupler 302 includes two inductors L1 and L2 and six capacitors C1, C2, C3, C4, C5, and C6. In this figure, the first and second hybrid ports 310-1 and 310-2 are depicted at the upper portion of the circuit diagram. The inductor L1 is coupled between the first hybrid port 310-1 and the second hybrid port 310-2. The inductor L2 is coupled between the third hybrid port 310-3 and the fourth hybrid port 310-4. The capacitor C2 is coupled between the first hybrid port 310-1 and the third hybrid port 310-3. The capacitor C5 is coupled between the second hybrid port 310-2 and the fourth hybrid port 310-4. Each of the capacitors C1, C4, C3, and C6 is respectively coupled between the ground and the first, second, third, and fourth hybrid ports 310-1, 310-2, 310-3, and 310-4.

In an example operation, from a first level analysis, a signal entering the first hybrid port 310-1 is split. One split signal propagates over the inductor L1 and reaches the second hybrid port 310-2 with a 0° phase. Another split signal propagates over the capacitor C2 and reaches the third hybrid port 310-3 with a 90° phase shift relative to the phase of the split signal at the second hybrid port 310-2. In some cases, two or more inductors may be magnetically coupled. As show in FIG. 5-1, but by way of example only, the first inductor L1 and the second inductor L2 can be magnetically coupled. The coupling coefficient k can have any value (e.g., k=0.6 to 0.8). This magnetic coupling can increase the usable bandwidth of a discrete quadrature hybrid. Each inductor can be realized using, for instance, at least one integrated passive device (IPD).

In FIG. 5-2, at 500-2 generally, an example hybrid coupler 302 includes seven inductors L1, L2, L3, L4, L5, L6, and L7 and six capacitors C1, C2, C3, C4, C5, and C6. In this figure, the first and second hybrid ports 310-1 and 310-2 are depicted at the lower portion of the circuit diagram. The seven inductors L1 to L7 are arranged into two squares that share the inductor L4 as shown. The inductors L3 and L6 are coupled in series with each other, and together they are coupled between the first hybrid port 310-1 and the second hybrid port 310-2. The inductors L2 and L5 are coupled in series with each other, and together they are coupled between the fourth hybrid port 310-4 and the third hybrid port 310-3. The inductor L1 is coupled between the first hybrid port 310-1 and the fourth hybrid port 310-4. The inductor L7 is coupled between the second hybrid port 310-2 and the third hybrid port 310-3.

Each of the six capacitors C1 to C6 is coupled between the ground and a respective node or corner of at least one of the two squares. The two circuit diagrams of FIGS. 5-1 and 5-2 are presented by way of example only. A hybrid coupler 302 can have a different quantity of components, can have different circuit connections, may include different components, may include active elements, and so forth. Further, although not explicitly depicted, two or more inductors of the hybrid coupler 302 of FIG. 5-2 can be magnetically coupled.

Figures 1, 6:
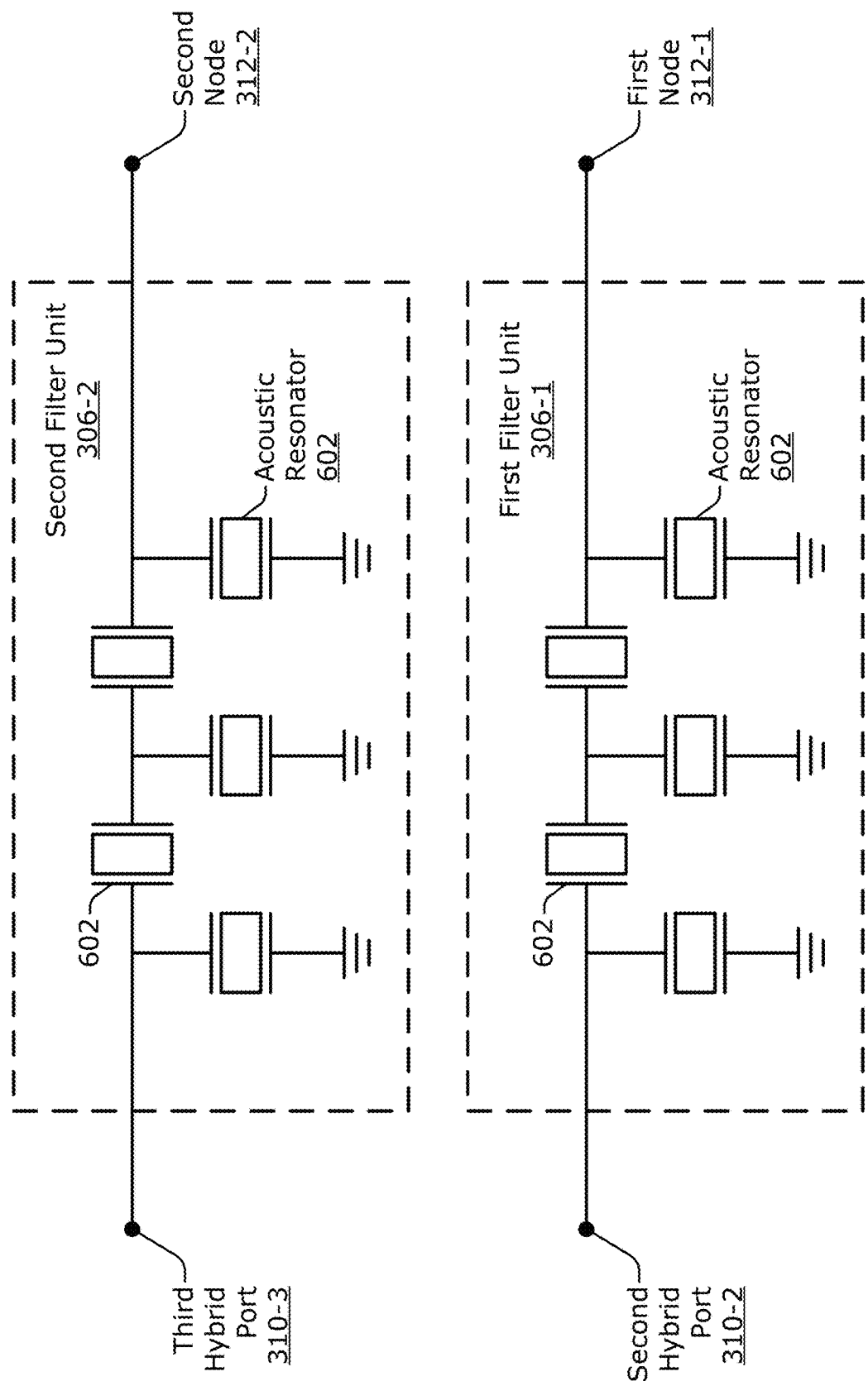
Figures 2, 6:
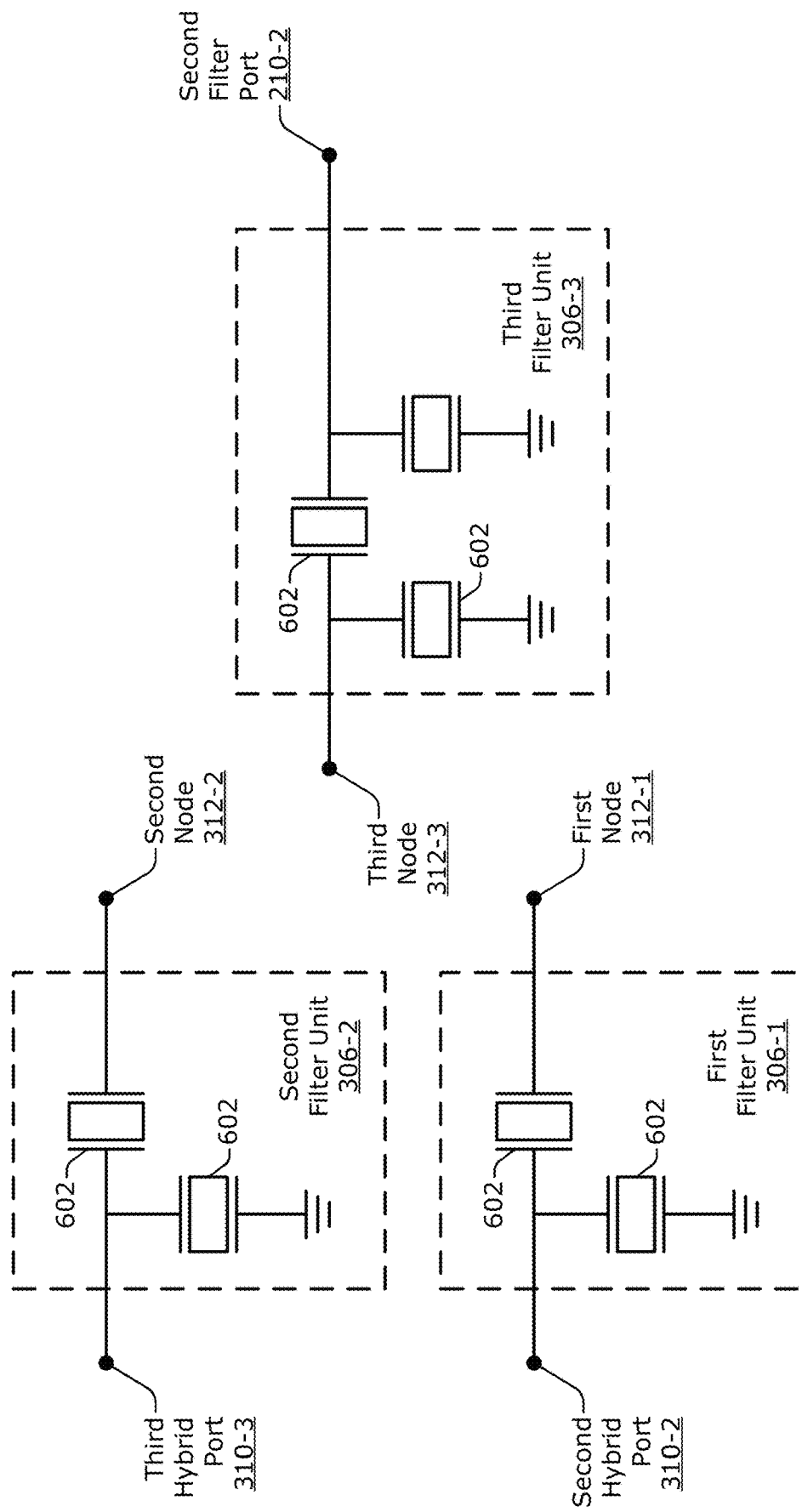

FIGS. 6-1 and 6-2 illustrate example filter units. The first and second filter units 306-1 and 306-2 of an example implementation 600-1 of FIG. 6-1 can correspond to the filter 130-1 of FIG. 3-1. The first, second, and third filter units 306-1, 306-2, and 306-3 of an example implementation 600-2 of FIG. 6-2 can correspond to the filter 130-2 of FIG. 3-2. Thus, the implementation 600-2 can enable a reduced component count relative to the implementation 600-1, at the possible cost of a slight increase in upstream reflectivity due to signal reflection from the third filter unit 306-3. Generally, each filter unit 306 can be implemented using any of multiple different filter types. Example filters for each filter unit 306 include an acoustic filter, a surface acoustic wave (SAW) filter, a bulk acoustic wave (BAW) filter, a film bulk acoustic resonator (FBAR) filter, a low-temperature co-fired ceramic (LTCC) filter, a lumped-element filter, a distributed-element filter, some combination thereof, and so forth.

In these example implementations 600-1 and 600-2, the components of each of the first and second filter units 306-1 and 306-2 include a same quantity of resonators, such as two or more resonators. Generally, the first filter unit 306-1 includes one or more first resonators 602, and the second filter unit 306-2 includes one or more second resonators 602. To facilitate substantially similar signal reflections and the resulting substantial cancelation of input port reflections, the one or more second resonators 602 can be realized as one or more duplicates of the one or more first resonators 602. Further, the circuit arrangement of the duplicated resonators can be replicated in the first and second filter units 306-1 and 306-2. Thus, each filter unit 306 includes at least one resonator, such as at least one shunt resonator or at least one series resonator. Each resonator is realized as an acoustic resonator 602 in the implementations 600-1 and 600-2. In alternative implementations, each resonator may be realized using non-acoustic (e.g., electrical) components, such as an inductor or a capacitor. Further, each filter unit 306 may include a different quantity of resonators (or other components) than those that are illustrated. For example, with reference to FIG. 6-2, each filter unit 306-1, 306-2, or 306-3 may be formed using a single resonator.

In FIG. 6-1, at the implementation 600-1, each filter unit has a same quantity of resonators. In this example, each of the first filter unit 306-1 and the second filter unit 306-2 includes five acoustic resonators 602. As shown, each filter unit has three shunt acoustic resonators 602 and two series acoustic resonators 602. Alternatively, a five-resonator filter unit may include two shunt acoustic resonators 602 and three series acoustic resonators 602. Further, each filter unit may include more or fewer acoustic resonators.

In FIG. 6-1, a five-resonator filter functionality or frequency response is achieved with ten resonators by duplicating the five resonators in each of the first and second filter units 306-1 and 306-2. A five-resonator filter functionality or frequency response can, however, be achieved with fewer resonators, such as with seven resonators, as shown in FIG. 6-2. In the example implementation 600-2, each of the first filter unit 306-1 and the second filter unit 306-2 includes two acoustic resonators 602. The third filter unit 306-3 includes three acoustic resonators 602.

Each of the pairs of acoustic resonators 602 in the first and second filter units 306-1 and 306-2 is used to respectively filter the first signal 320-1 or the second signal 320-2 (e.g., of FIG. 3-4) as a first stage of filtering. After combining the first and second filtered signals 322-1 and 322-2 to form the combined filtered signal 324, the third filter unit 306-3 provides filtering using the "other" three acoustic resonators 602 as a second stage of filtering. Thus, each of the first filtering path and the second filtering path of a respective distributed filter unit 316 filters a signal with five total acoustic resonators 602 (e.g., two acoustic resonators and then three acoustic resonators). This distributed filtering approach across the signal combiner 304 is also described above with reference to FIG. 3-3.

Figures 1, 7:
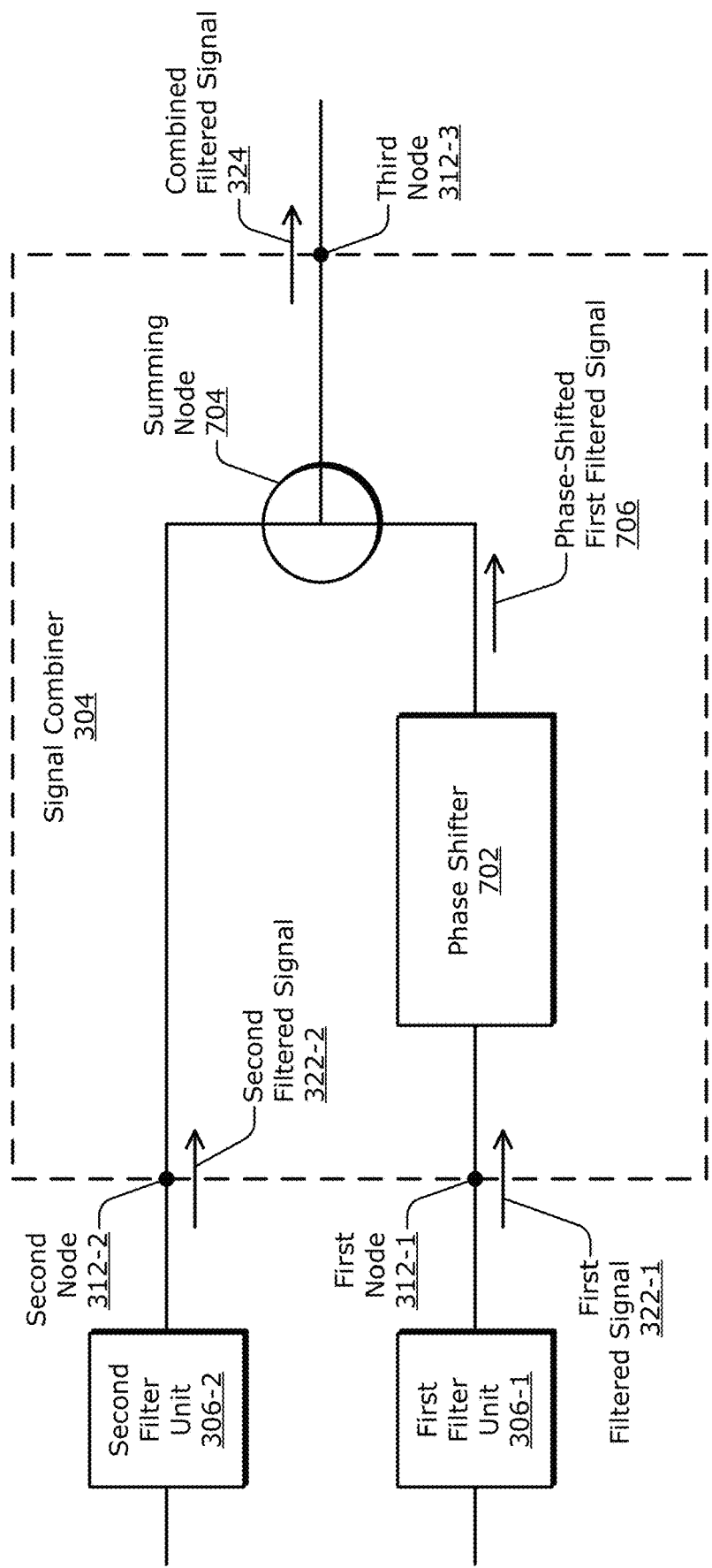
Figures 2, 7:
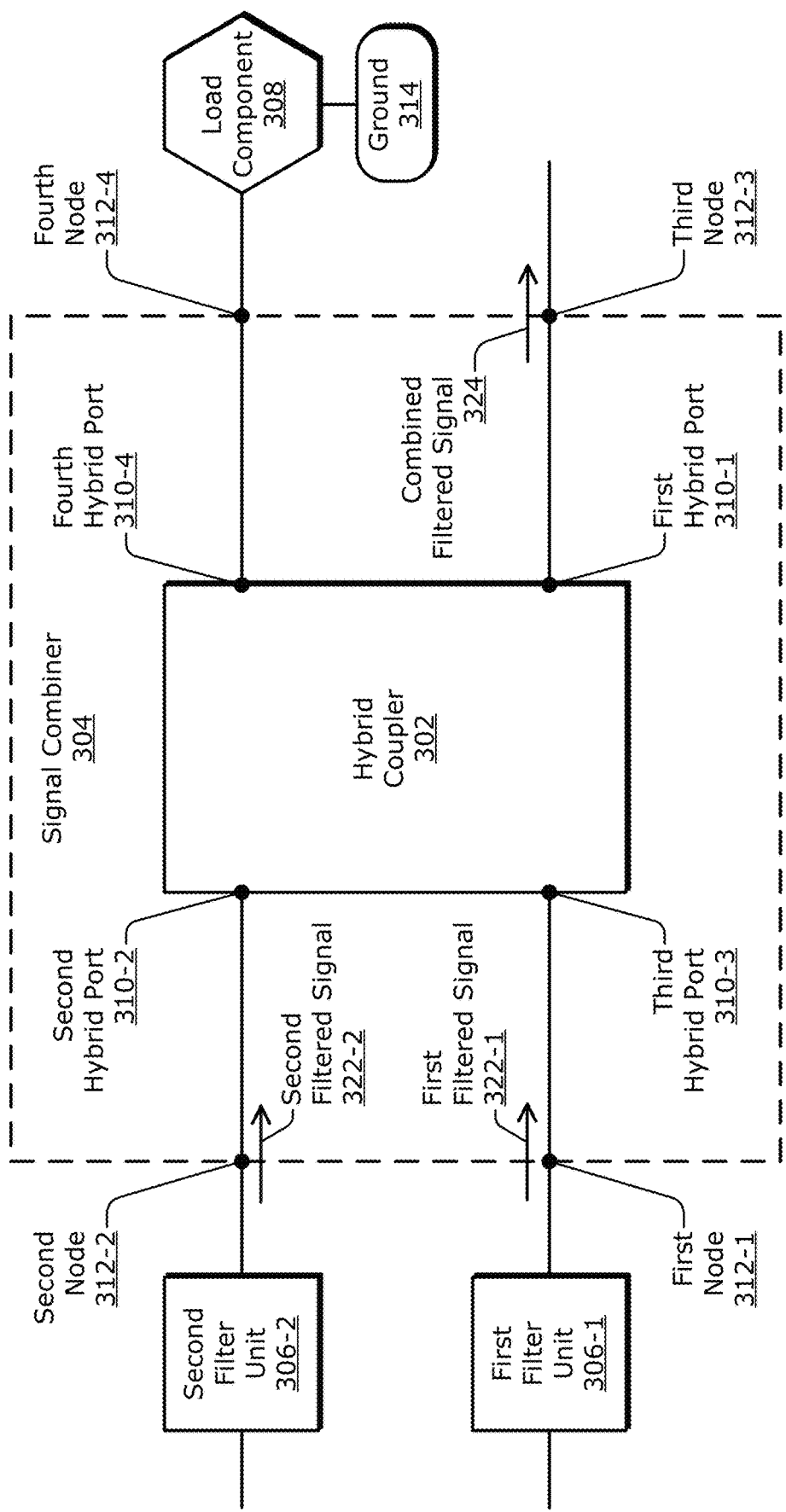

FIGS. 7-1 and 7-2 illustrate example signal combiners. Each signal combiner 304 operates to combine the first filtered signal 322-1 and the second filtered signal 322-2 to produce the combined filtered signal 324, as is described above with reference to FIG. 3-4. As described with reference to FIG. 4-1, the first and second filtered signals 322-1 and 322-2 are out-of-phase with respect to each other by 90°. Accordingly, the signal combiner 304 can account for the phase difference as well as join the two split signals.

In FIG. 7-1, at an example implementation 700-1, the signal combiner 304 includes a phase shifter 702 and a summing node 704. The phase shifter 702 is coupled between the first node 312-1 and the summing node 704. The summing node 704 is co-located (e.g., can have a common equipotential with) the second node 312-2 and the third node 312-3. Alternatively, one or more other components may be coupled between these nodes. The phase shifter 702 can be realized with various circuitry and provide different phase-shift amounts. In some aspects, the phase shifter 702 can include, for example, two capacitors and an inductor as a 90° CLC phase shifter. The two capacitors are coupled together in series between the first node 312-1 and the summing node 704. The inductor is coupled between the ground and a central node located between the two series-connected capacitors. In operation, the phase shifter 702 phase shifts the first filtered signal 322-1 to produce a phase-shifted first filtered signal 706. The phases of the second filtered signal 322-2 and the phase-shifted first filtered signal 706 are therefore aligned.

In some cases, the first filtered signal 322-1, which is output by the first filter unit 306-1, may be 90° "ahead" of the second filtered signal 322-2. The phase shifter 702 can therefore delay the phase of the first filtered signal 322-1 by 90° to align the phase-shifted first filtered signal 706 with the second filtered signal 322-2. The summing node 704 then combines the second filtered signal 322-2 with the phase-shifted first filtered signal 706 to produce the combined filtered signal 324 at the third node 312-3. The summing node 704 can join the signals by operating as, for instance, a current-summing node. The third node 312-3 can be coupled to the second filter port 210-2 "directly" or via one or more components. These one or more components can include, but are not limited to, a third filter unit 306-3 (e.g., of FIGS. 3-2 to 3-4). With the example implementation 700-1, a filter 130 may provide unidirectional absorption relative to the first filter port 210-1, even though the filter 130 can be operated to filter signals bidirectionally. This unidirectional absorption may be sufficient in a variety of scenarios, such as if the second filter port 210-2 is coupled to a passive element, like an antenna.

In contrast for FIG. 7-2, at an example implementation 700-2, the signal combiner 304 includes another hybrid coupler 302. By including a second hybrid coupler 302 in a filter 130 nearer the second filter port 210-2 of the filter 130, the filter 130 can provide bidirectional absorption. This may involve, however, more components or additional space as compared to the phase shifter 702 and the summing node 704 of the implementation 700-1. As shown, the first node 312-1 of the signal combiner 304 is coupled to the third hybrid port 310-3 of the other hybrid coupler 302, and the second node 312-2 is coupled to the second hybrid port 310-2. The third node 312-3 is coupled to the first hybrid port 310-1, and a fourth node 312-4 of the signal combiner 304 is coupled to the fourth hybrid port 310-4 of the hybrid coupler 302. The fourth node 312-4 and the fourth hybrid port 310-4 are coupled to another load component 308, which is also coupled to the ground 314.

In example operations generally, with two input signals, the hybrid coupler 302 produces two pairs of split signals, with one split signal in each pair being phase-shifted relative to the other split signal in the pair. The hybrid coupler 302 respectively combines two split signals from different pairs of split signals, including one combination that produces the combined filtered signal 324. The numbering of the hybrid ports is maintained in FIG. 7-2 as compared to those of FIGS. 4-1 and 4-2. Thus, to produce the combined filtered signal 324, a split signal of the first filtered signal 322-1, which is input to the hybrid coupler 302 via the third hybrid port 310-3, is phase-shifted as this split signal propagates through the circuitry of the hybrid coupler 302 to the first hybrid port 310-1. A split signal of the second filtered signal 322-2, on the other hand, is not phase-shifted as the signal propagates from the second hybrid port 310-2 to the first hybrid port 310-1.

More specifically, within the hybrid coupler 302, the circuitry thereof splits the first filtered signal 322-1 into a split first filtered signal and a phase-shifted split first filtered signal. The hybrid coupler 302 also splits the second filtered signal 322-2 into a split second filtered signal and a phase-shifted split second filtered signal. The circuitry routes the phase-shifted split first filtered signal and the split second filtered signal to the first hybrid port 310-1 for combining as the combined filtered signal 324. The hybrid coupler 302 also routes the split first filtered signal and the phase-shifted split second filtered signal to the fourth hybrid port 310-4 for combining and then diversion to the other load component 308.

Because the second signal (e.g., including the second filtered signal 322-2) of the second signaling pathway is phase-shifted by the hybrid coupler at the first filter port 210-1 (e.g., as depicted in FIGS. 3-1 to 3-4 and 4-1), the phases are aligned at the first hybrid port 310-1 responsive to the phase shifting of a split version of the first filtered signal 322-1 by the other hybrid coupler 302 of FIG. 7-2. The illustrated hybrid coupler 302 therefore produces the combined filtered signal 324 by constructively combining a split version of the second filtered signal 322-2 with a phase-shifted split version of the first filtered signal 322-1 at the first hybrid port 310-1, which corresponds to the third node 312-3 of the signal combiner 304.

If the third node 312-3 is coupled to the second filter port 210-2 (e.g., of FIG. 3-1), the filter 130 can provide signal power absorption to reduce reflectivity of signals accepted by the filter 130 via the second filter port 210-2. This example implementation 700-2 therefore provides a filter 130 with bidirectional absorption. Schematic examples of filters providing bidirectional absorption are described below with reference to FIGS. 8-2 and 8-4. With respect to the fourth hybrid port 310-4 in FIG. 7-2, the hybrid coupler 302 destructively combines a split version of the first filtered signal 322-1 with a phase-shifted split version of the second filtered signal 322-2. Any remaining signal power after the destructive combination is routed through the other load component 308 to the ground 314.

Figures 1, 8:
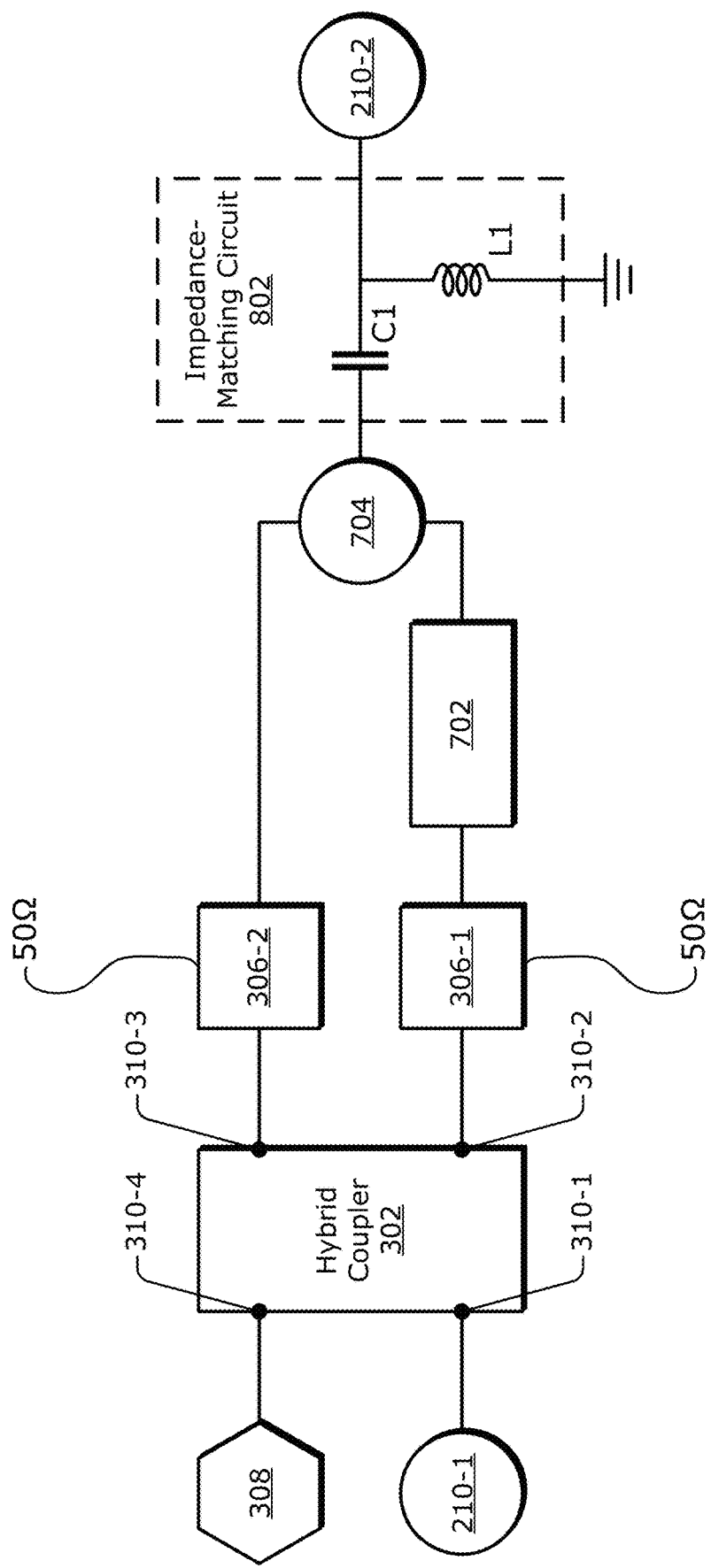
Figures 2, 8:
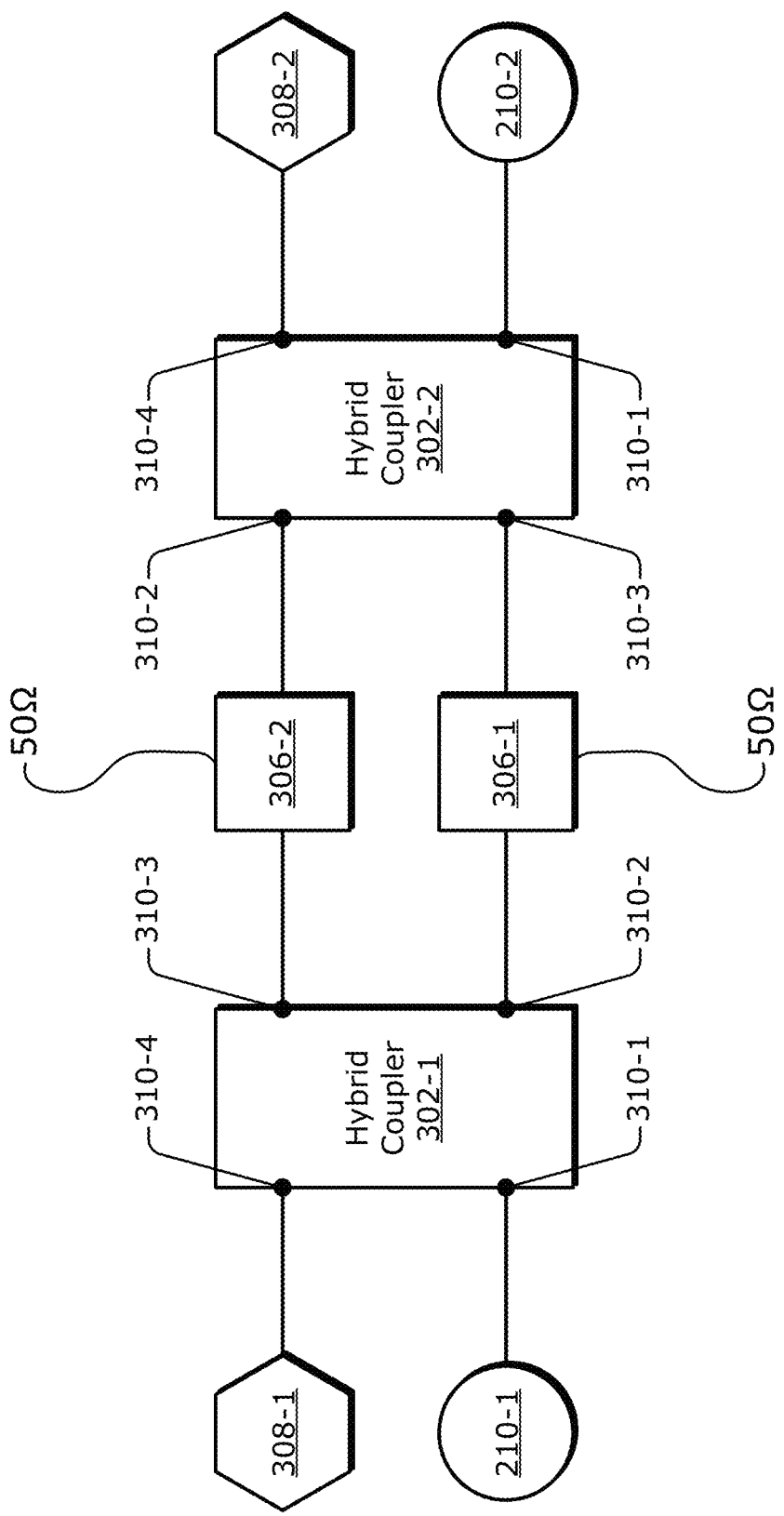
Figures 3, 8:
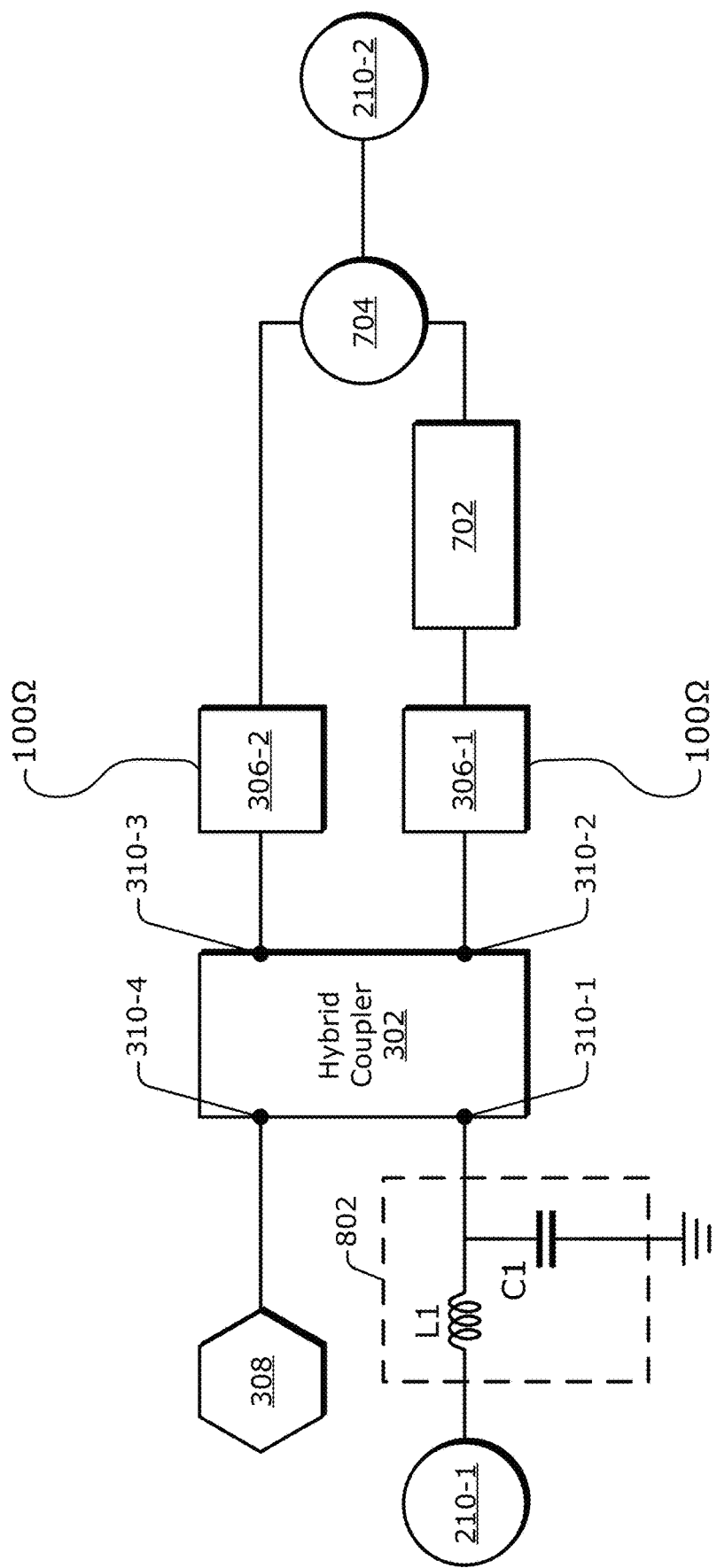
Figures 4, 8:
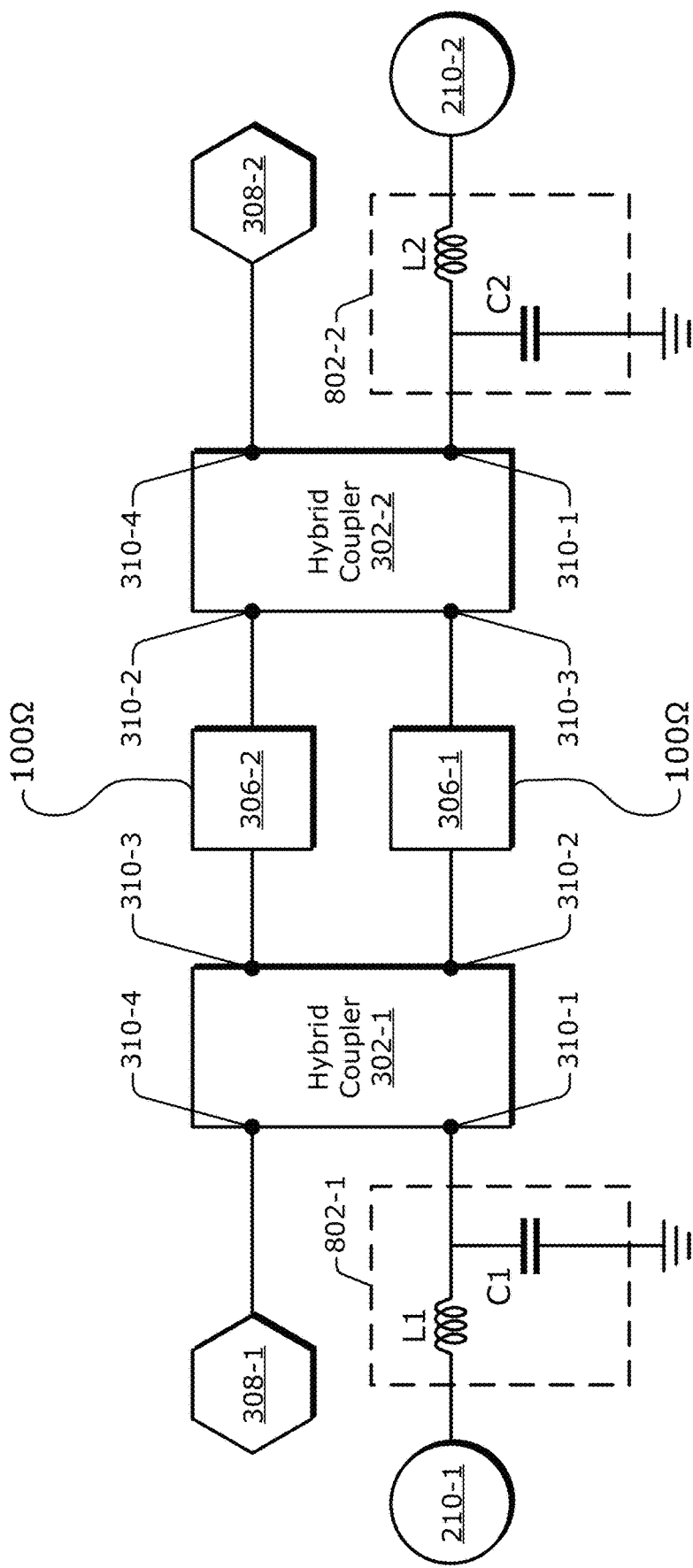

FIGS. 8-1 to 8-4 illustrate example implementations of absorptive filters, including ones with unidirectional absorption and ones with bidirectional absorption. The implementations correspond to different examples of the filter 130-1 of FIG. 3-1. The implementations of FIGS. 8-1 and 8-2 deploy filter units having 50 ohm (50Ω) impedances, and the implementations of FIGS. 8-3 and 8-4 deploy filter units having 100Ω impedances. The implementations of FIGS. 8-1 and 8-3 each employ a signal combiner 304 (not explicitly indicated) with a phase shifter 702 and a summing node 704. These implementations therefore correspond to FIG. 7-1 and a unidirectional absorption functionality, even with a bidirectional filter. The implementations of FIGS. 8-2 and 8-4, on the other hand, each employ a signal combiner 304 (not explicitly indicated) with a hybrid coupler 302. These implementations with two hybrid couplers therefore correspond to FIG. 7-2 and a bidirectional absorption functionality.

In the example implementation 800-1 of FIG. 8-1, the first filter unit 306-1 and the second filter unit 306-2 each have a 50Ω impedance. Each respective filter unit 306 is coupled along a respective filtering path that is parallel to another filtering path (e.g., a first filtering path and a second filtering path) between the hybrid coupler 302 and the summing node 704. The implementation 800-1 also includes an impedance matching circuit 802 that includes, for instance, a capacitor C1 and an inductor L1, with the inductor L1 coupled to the ground. The impedance matching circuit 802 provides a 25Ω to 50Ω impedance transformation between the summing node 704 and the second filter port 210-2.

In the example implementation 800-2 of FIG. 8-2, the first filter unit 306-1 and the second filter unit 306-2 each have a 50Ω impedance. The example implementation 800-2 also includes a first load component 308-1, a first hybrid coupler 302-1, a second load component 308-2, and a second hybrid coupler 302-2. Each respective filter unit 306 is coupled along a respective filtering path that is parallel to the other filtering path (e.g., a first filtering path and a second filtering path) between the first hybrid coupler 302-1 and the second hybrid coupler 302-2. The phases of the split signals, which are to propagate through a filter port 210, are aligned after propagating in either direction using the dual hybrid coupler arrangement. To do so, the first filter unit 306-1 is coupled between the second hybrid port 310-2 of the first hybrid coupler 302-1 and the third hybrid port 310-3 of the second hybrid coupler 302-2. The second filter unit 306-2, on the other hand, is coupled between the third hybrid port 310-3 of the first hybrid coupler 302-1 and the second hybrid port 310-2 of the second hybrid coupler 302-2. Accordingly, each of the first and second split signals is phase-shifted once during the propagation between the first and second filter ports 210-1 and 210-2.

In the example implementation 800-3 of FIG. 8-3, the first filter unit 306-1 and the second filter unit 306-2 each have a 100Ω impedance. Each respective filter unit 306 is coupled along a respective filtering path that is parallel to the other filtering path (e.g., a first filtering path and a second filtering path) between the hybrid coupler 302 and the summing node 704. The implementation 800-3 also includes an impedance matching circuit 802 that includes, for instance, a capacitor C1 and an inductor L1, with the capacitor C1 coupled to the ground. The impedance matching circuit 802 provides a 50Ω to 100Ω impedance transformation between the first filter port 210-1 and the first hybrid port 310-1 of the hybrid coupler 302.

In the example implementation 800-4 of FIG. 8-4, the first filter unit 306-1 and the second filter unit 306-2 each have a 100Ω impedance. The example implementation 800-4 also includes a first load component 308-1, a first hybrid coupler 302-1, a second load component 308-2, and a second hybrid coupler 302-2. Each respective filter unit 306 is coupled along a respective filtering path that is parallel to the other filtering path (e.g., a first filtering path and a second filtering path) between the first hybrid coupler 302-1 and the second hybrid coupler 302-2.

The implementation 800-4 further includes a first impedance matching circuit 802-1 and a second impedance matching circuit 802-2. The first impedance matching circuit 802-1 includes, for instance, a capacitor C1 and an inductor L1, with the capacitor C1 coupled to the ground. The first impedance matching circuit 802-1 provides a 50Ω to 100Ω impedance transformation between the first filter port 210-1 and the first hybrid port 310-1 of the first hybrid coupler 302-1. The second impedance matching circuit 802-2 includes, for instance, a capacitor C2 and an inductor L2, with the capacitor C2 coupled to the ground. The second impedance matching circuit 802-2 provides a 100Ω to 50Ω impedance transformation between the first hybrid port 310-1 of the second hybrid coupler 302-2 and the second filter port 210-2.

Figure 9:
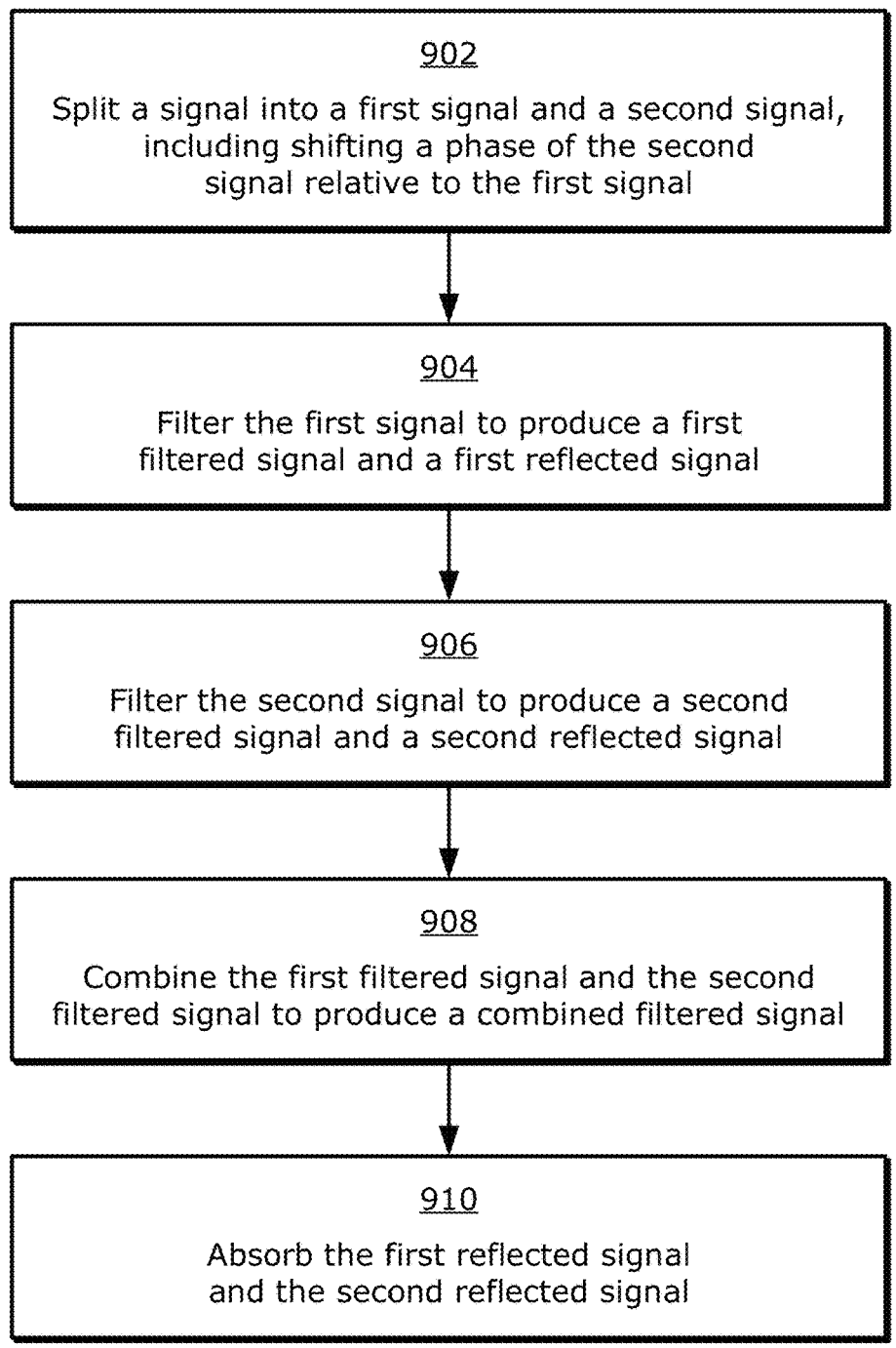
FIG. 9 is a flow diagram illustrating an example process for operating an absorptive filter.

FIG. 9 is a flow diagram illustrating an example process 900 for operating an absorptive filter. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900, or an alternative process. Operations represented by the illustrated blocks of the process 900 may be performed by an electronic device 102, including by a wireless interface device 120 thereof. More specifically, the operations of the process 900 may be performed by a filter 130 that is part of an RF front-end 128 or that is part of other circuitry of an electronic device.

At block 902, a signal is split into a first signal and a second signal, including a shifting of a phase of the second signal relative to the first signal. For example, the filter 130 can split a signal 320 into a first signal 320-1 and a second signal 320-2. The filter 130 can also shift a phase of the second signal 320-2 relative to a phase of the first signal 320-1. To do so, a hybrid coupler 302 may split the power of the signal 320 equally into the first signal 320-1 and the second signal 320-2 while separating the phases of the two signals by 90° by using a hybrid matrix, which may include passive elements.

At block 904, the first signal is filtered to produce a first filtered signal and a first reflected signal. For example, the filter 130 can filter the first signal 320-1 to produce a first filtered signal 322-1 and a first reflected signal 328-1. This filtering may be performed by a first filter unit 306-1 having some quantity of resonators, such as acoustic resonators 602. The first reflected signal 328-1 may be reflected back towards the hybrid coupler 302.

At block 906, the second signal is filtered to produce a second filtered signal and a second reflected signal. For example, the filter 130 can filter the second signal 320-2 to produce a second filtered signal 322-2 and a second reflected signal 328-2. For instance, a second filter unit 306-2 may produce the second filtered signal 322-2 and the second reflected signal 328-2 based on the second signal 320-2 using a same quantity of resonators as is included in the first filter unit 306-1. In some cases, the second reflected signal 328-2 and the first reflected signal 328-1 may have respective first and second phases that are separated by 90°.

At block 908, the first filtered signal and the second filtered signal are combined to produce a combined filtered signal. For example, the filter 130 can combine the first filtered signal 322-1 and the second filtered signal 322-2 to produce a combined filtered signal 324. A signal combiner 304, for instance, may combine the first filtered signal 322-1 and the second filtered signal 322-2 using a phase shifter 702 and a summing node 704 or using another hybrid coupler 302. The filter 130 can output a filtered signal 326 that is based on the combined filtered signal 324. The filtered signal 326 may comprise the combined filtered signal 324, may comprise a further filtered version of the combined filtered signal 324 (e.g., using a third filter unit 306-3), may otherwise be derived from the combined filtered signal 324, and so forth.

At block 910, the first reflected signal and the second reflected signal are absorbed. For example, the filter 130 can absorb the first reflected signal 328-1 and the second reflected signal 328-2. To do so, the hybrid coupler 302 may phase shift a split version of the second reflected signal 328-2 and combine the phase-shifted split version of the second reflected signal 328-2 with a split version of the first reflected signal 328-1. With reference to FIG. 4-2, the hybrid coupler 302 may route a split first reflected signal 410 and a phase-shifted second reflected signal 422 to a first hybrid port 310-1 of the hybrid coupler 302 for destructive combining of the two split signals. The destructive combining substantially cancels the first and second reflected signals 328-1 and 328-2 relative to the first hybrid port 310-1, which results in signal absorption from the perspective of an upstream component that supplies the signal 320 to the filter 130.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a filter comprising:
   a hybrid coupler comprising a first hybrid port, a second hybrid port, and a third hybrid port, the first hybrid port coupled to a first filter port;
   a signal combiner coupled to a second filter port;
   a first filter unit coupled between the second hybrid port and the signal combiner;
   a second filter unit coupled between the third hybrid port and the signal combiner; and
   a third filter unit coupled between the signal combiner and the second filter port,
   the first filter unit, the second filter unit, and the third filter unit comprising multiple distributed filter units that comprise a filter circuit having a filter response.

2. The apparatus of claim 1, wherein:
   the first filter unit comprises one or more first components;
   the second filter unit comprises one or more second components; and
   the one or more first components are at least substantially similar to the one or more second components.

3. The apparatus of claim 1, wherein:
   the first filter unit comprises one or more first resonators;
   the second filter unit comprises one or more second resonators; and
   the one or more second resonators comprise one or more duplicates of the one or more first resonators.

4. The apparatus of claim 1, wherein:
   the first filter unit has a first filter response;
   the second filter unit has a second filter response; and
   the first filter response is substantially similar to the second filter response.

5. The apparatus of claim 1, wherein the hybrid coupler is configured to direct signals that reflect from the first filter unit and the second filter unit to destructively combine at the first hybrid port.

6. The apparatus of claim 5, wherein:
   the hybrid coupler comprises a fourth hybrid port; and
   the hybrid coupler is configured to direct the signals that reflect from the first filter unit and the second filter unit to constructively combine at the fourth hybrid port.

7. The apparatus of claim 6, further comprising:
   a load component coupled between the fourth hybrid port and a ground.

8. The apparatus of claim 1, wherein the hybrid coupler comprises a hybrid matrix comprising multiple elements.

9. The apparatus of claim 1, wherein:
   the hybrid coupler comprises a first hybrid coupler of the filter; and
   the signal combiner comprises a second hybrid coupler of the filter,
   the second hybrid coupler comprising a first hybrid port, a second hybrid port, and a third hybrid port,
   the first hybrid port of the second hybrid coupler coupled to the third filter unit,
   the second hybrid port of the second hybrid coupler coupled to the second filter unit, and
   the third hybrid port of the second hybrid coupler coupled to the first filter unit.

10. The apparatus of claim 1, wherein each of the first filter unit and the second filter unit comprises at least one of:
    an acoustic filter;

a surface acoustic wave (SAW) filter;
a bulk acoustic wave (BAW) filter;
a film bulk acoustic resonator (FBAR) filter;
a low-temperature co-fired ceramic (LTCC) filter;
a lumped-element filter; or
a distributed-element filter.

11. The apparatus of claim 1, wherein:
the first filter unit comprises a first microacoustic filter; and
the second filter unit comprises a second microacoustic filter.

12. The apparatus of claim 1, wherein the first filter unit and the second filter unit each comprise:
at least one shunt resonator; and
at least one series resonator.

13. The apparatus of claim 1, wherein:
the multiple distributed filter units comprise a first distributed filter unit and a second distributed filter unit;
the first filter unit and the third filter unit comprise the first distributed filter unit; and
the second filter unit and the third filter unit comprise the second distributed filter unit.

14. The apparatus of claim 13, wherein:
the first filter unit comprises a first stage of the first distributed filter unit;
the third filter unit comprises a second stage of the first distributed filter unit;
the second filter unit comprises a first stage of the second distributed filter unit; and
the third filter unit comprises a second stage of the second distributed filter unit.

15. The apparatus of claim 1, wherein:
the first filter unit comprises two or more resonators;
the second filter unit comprises two or more resonators; and
the third filter unit comprises at least one resonator.

16. The apparatus of claim 1, further comprising:
at least one antenna; and
a wireless interface device coupled to the at least one antenna, the wireless interface device comprising the filter.

17. The apparatus of claim 16, wherein:
the wireless interface device comprises a radio-frequency front-end; and
the radio-frequency front-end comprises the filter, the filter coupled to the at least one antenna.

18. The apparatus of claim 17, wherein:
the radio-frequency front-end comprises a power amplifier and a low-noise amplifier; and
the filter is switchably coupled to the power amplifier and the low-noise amplifier.

19. The apparatus of claim 1, wherein:
the first filter unit comprises:
a first acoustic resonator; and
a second acoustic resonator; and
the second filter unit comprises:
a first acoustic resonator; and
a second acoustic resonator.

20. The apparatus of claim 19, wherein:
the third filter unit comprises:
a first acoustic resonator;
a second acoustic resonator; and
a third acoustic resonator.

21. The apparatus of claim 20, wherein:
the first acoustic resonator of the first filter unit comprises a shunt resonator;
the second acoustic resonator of the first filter unit comprises a series resonator;
the first acoustic resonator of the second filter unit comprises a shunt resonator;
the second acoustic resonator of the second filter unit comprises a series resonator;
the first acoustic resonator of the third filter unit comprises a shunt resonator;
the second acoustic resonator of the third filter unit comprises a series resonator; and
the third acoustic resonator of the third filter unit comprises a shunt resonator.

22. The apparatus of claim 20, wherein:
the multiple distributed filter units comprise a first distributed filter unit and a second distributed filter unit;
the first distributed filter unit comprises:
the first acoustic resonator of the first filter unit;
the second acoustic resonator of the first filter unit;
the first acoustic resonator of the third filter unit;
the second acoustic resonator of the third filter unit; and
the third acoustic resonator of the third filter unit; and
the second distributed filter unit comprises:
the first acoustic resonator of the second filter unit;
the second acoustic resonator of the second filter unit;
the first acoustic resonator of the third filter unit;
the second acoustic resonator of the third filter unit; and
the third acoustic resonator of the third filter unit.

23. An apparatus for filtering a signal, the apparatus comprising:
means for splitting the signal into a first signal and a second signal, the second signal having a phase that is shifted relative to the first signal;
means for filtering the first signal to produce a first filtered signal and a first reflected signal;
means for filtering the second signal to produce a second filtered signal and a second reflected signal;
means for combining the first filtered signal and the second filtered signal to produce a combined filtered signal, the means for combining comprising:
means for shifting a phase of the first filtered signal to produce a phase-shifted first filtered signal; and
means for summing the phase-shifted first filtered signal and the second filtered signal;
means for absorbing the first reflected signal and the second reflected signal; and
means for filtering the combined filtered signal to produce a filtered signal.

24. The apparatus of claim 23, wherein the means for splitting comprises:
means for splitting the first reflected signal into a split first reflected signal and a phase-shifted first reflected signal;
means for splitting the second reflected signal into a split second reflected signal and a phase-shifted second reflected signal;
means for routing the split first reflected signal and the phase-shifted second reflected signal to an input; and
means for routing the split second reflected signal and the phase-shifted first reflected signal to the means for absorbing.

25. An apparatus for filtering a signal, the apparatus comprising:
means for splitting the signal into a first signal and a second signal, the second signal having a phase that is shifted relative to the first signal;
means for filtering the first signal to produce a first filtered signal and a first reflected signal;

means for filtering the second signal to produce a second filtered signal and a second reflected signal;

means for combining the first filtered signal and the second filtered signal to produce a combined filtered signal, the means for combining comprising:

means for splitting the first filtered signal into a split first filtered signal and a phase-shifted split first filtered signal;

means for splitting the second filtered signal into a split second filtered signal and a phase-shifted split second filtered signal; and means for routing the phase-shifted split first filtered signal and the split second filtered signal to an output of the means for combining;

means for absorbing the first reflected signal and the second reflected signal; and means for filtering the combined filtered signal to produce a filtered signal.

26. The apparatus of claim 25, wherein the means for splitting comprises:

means for splitting the first reflected signal into a split first reflected signal and a phase-shifted first reflected signal;

means for splitting the second reflected signal into a split second reflected signal and a phase-shifted second reflected signal;

means for routing the split first reflected signal and the phase-shifted second reflected signal to an input; and means for routing the split second reflected signal and the phase-shifted first reflected signal to the means for absorbing.

27. An apparatus comprising:
a filter comprising:
   a hybrid coupler comprising a first hybrid port, a second hybrid port, a third hybrid port, and a fourth hybrid port, the first hybrid port coupled to a first filter port;
   a signal combiner coupled to a second filter port;
   a first filter unit coupled between the second hybrid port and the signal combiner;
   a second filter unit coupled between the third hybrid port and the signal combiner; and
   a third filter unit coupled between the signal combiner and the second filter port; and
a load component coupled between the fourth hybrid port and a ground, the hybrid coupler configured to:
   direct signals that reflect from the first filter unit and the second filter unit to destructively combine at the first hybrid port; and
   direct the signals that reflect from the first filter unit and the second filter unit to constructively combine at the fourth hybrid port.

28. An apparatus comprising:
a filter comprising:
   a hybrid coupler comprising a first hybrid port, a second hybrid port, and a third hybrid port, the first hybrid port coupled to a first filter port;
   a signal combiner coupled to a second filter port;
   a first filter unit coupled between the second hybrid port and the signal combiner;
   a second filter unit coupled between the third hybrid port and the signal combiner; and
   a third filter unit coupled between the signal combiner and the second filter port,
   the first filter unit and the third filter unit comprising a first distributed filter unit; and
   the second filter unit and the third filter unit comprising a second distributed filter unit.

29. The apparatus of claim 28, wherein:
the first filter unit comprises a first stage of the first distributed filter unit;
the third filter unit comprises a second stage of the first distributed filter unit;
the second filter unit comprises a first stage of the second distributed filter unit; and
the third filter unit comprises a second stage of the second distributed filter unit.

30. The apparatus of claim 28, wherein:
the first filter unit comprises:
   a first acoustic resonator; and
   a second acoustic resonator;
the second filter unit comprises:
   a first acoustic resonator; and
   a second acoustic resonator; and
the third filter unit comprises:
   a first acoustic resonator;
   a second acoustic resonator; and
   a third acoustic resonator.

\* \* \* \* \*